(12) United States Patent
Henstra et al.

(10) Patent No.: US 11,114,271 B2
(45) Date of Patent: Sep. 7, 2021

(54) SIXTH-ORDER AND ABOVE CORRECTED STEM MULTIPOLE CORRECTORS

(71) Applicant: FEI Company, Hillsboro, OR (US)

(72) Inventors: Alexander Henstra, Eindhoven (NL); Peter Christiaan Tiemeijer, Eindhoven (NL); Marcel Niestadt, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/692,851

(22) Filed: Nov. 22, 2019

(65) Prior Publication Data

US 2021/0159044 A1 May 27, 2021

(51) Int. Cl.
*H01J 37/153* (2006.01)
*H01J 37/26* (2006.01)

(52) U.S. Cl.
CPC ............ *H01J 37/153* (2013.01); *H01J 37/26* (2013.01); *H01J 2237/1534* (2013.01); *H01J 2237/28* (2013.01)

(58) Field of Classification Search
CPC .. H01J 37/153; H01J 37/26; H01J 2237/1534; H01J 2237/28
See application file for complete search history.

(56) References Cited

U.S. PATENT DOCUMENTS

| 8,841,630 B2 | 9/2014 | Henstra |
| 2019/0304739 A1 | 10/2019 | Morishita |

FOREIGN PATENT DOCUMENTS

| EP | 1717840 A2 | 11/2006 |
| EP | 2325862 A1 | 5/2011 |

OTHER PUBLICATIONS

EP20207973.7, Extended European Search Report, dated Apr. 16, 2021, 8 pages.
Haider M et al., "Present and future hexapole aberration corrector for high-resolution electron microscopy", Advances in Imaging and Electron Physics, vol. 153, Jan. 1, 2008 (Jan. 1, 2008), pp. 43-119, XP009134828, ISSN: 1076-5670.

*Primary Examiner* — Nicole M Ippolito
*Assistant Examiner* — Hanway Chang

(57) ABSTRACT

Correctors for correcting axial aberrations of a particle-optical lens in a charged particle microscope system, according to the present disclosure include a first primary multipole that generates a first primary multipole field when a first excitation is applied to the first primary multipole, and a second primary multipole that generates a second primary multipole field when a second excitation is applied to the second primary multipole. The first primary multipole is not imaged onto the second primary multipole such that a combination fourth-order aberration is created. The correctors further include a secondary multipole for correcting the fourth-order aberration and the sixth-order aberration. Such correctors may further include a tertiary multipole for correcting an eighth-order aberration.

20 Claims, 13 Drawing Sheets

1400

1500

SIXTH-ORDER AND ABOVE CORRECTED STEM MULTIPOLE CORRECTORS

BACKGROUND OF THE INVENTION

Particle-optical microscopes utilize round lenses to direct electron/charged particle beams to irradiate a specimen. However, round lenses generate positive spherical aberration coefficients that restrict higher opening angles and inhibit resolution and probe current. To address this issue, current particle-optical microscopes incorporate multipole correctors to reduce and/or correct spherical aberrations. For hexapole correctors, conventional practice is to carefully image primary multipoles such that the fourth-order three-lobe aberration $D_4$ is zero. For example, the hexapole corrector invented by Rose in 1990 features two strong identical hexapoles. When the two strong hexapoles in the Rose corrector are carefully imaged onto each other with magnification $-1$, this cancels their lowest-order effect (i.e., the three-fold astigmatism $A_2$) and also results in the nullification of the fourth-order three-lobe aberration $D_4$. For this Rose corrector, imaging the primary hexapoles onto each other corresponds to the hexapole midplanes being imaged onto each other (i.e., the midplanes are exactly conjugate).

However, imaging multipole midplanes onto each other in this way is not the only way that the $D_4$ aberration is nullified in current practice. For example, for some other hexapole correctors types (e.g., hexapole correctors comprising more than two primary hexapoles), a large aberration $D_4$ would be generated if all primary hexapole midplanes are exactly mutually conjugate. In such hexapole correctors, in order to nullify $D_4$, the midplane of one primary hexapole is made conjugate to planes which are adjacent to, but not all identical to the midplanes of the other primary hexapoles.

While the fourth-order three-lobe aberration $D_4$ is zero for conventional multipole correctors, conventional multipole correctors also generate various higher-order aberrations that limit the resolution of the microscope (e.g., the sixth-order three-lobe aberration $D_6$, the eight-order three-lobe aberration $D_8$ etc.). For example, the S-CORR corrector, described in U.S. Pat. No. 8,841,630, is free of six-fold astigmatism, but aberrations such as the sixth-order three-lobe aberration $D_6$ and the eighth-order three-lobe aberration $D_8$ are not cancelled. Therefore, even if current hexapole correctors (such as the Rose Corrector and the S-CORR corrector) are mechanically perfect, the current particle-optical microscopes employing them are still limited by a sixth-order aberration (i.e., the sixth-order three-lobe aberration $D_6$). Because of this, the sixth-order aberration is a fundamental barrier that limits the imaging capabilities of current charged particle-optical microscopes employing hexapole correctors. Also, for similar reasons current charged particle-optical microscopes employing quadrupole-octupole correctors are limited by seventh-order aberrations. Accordingly, there is a desire to reduce such higher-order aberrations of Cs-correctors.

SUMMARY OF THE INVENTION

Correctors for correcting axial aberrations of a particle-optical lens in a charged particle microscope system, according to the present disclosure include a first primary hexapole that generates a first primary hexapole field when a first excitation voltage or current is applied to the first primary hexapole, and a second primary hexapole positioned between the first primary hexapole and a lens which is a source of spherical aberration when the corrector is used within the charged particle microscope system. Within the remainder of this document, this lens is sometimes referred to as the particle-optical lens. Generally, the lens that is the main source of spherical aberration is the lens which acts as the objective lens in the charged particle microscope system. The second primary hexapole generates a second primary hexapole field when a second excitation is applied to the second primary hexapole. According to some embodiments of the present disclosure, the first primary hexapole is not carefully imaged onto the second primary hexapole. Instead, by a somewhat mismatching the image of the first primary hexapole on the second primary hexapole, a combination fourth-order aberration is created. In such embodiments, the correctors include a secondary hexapole for correcting the fourth-order aberration and a sixth-order aberration, where the secondary hexapole is positioned between the second primary hexapole and the particle-optical lens when the corrector is used within the charged particle microscope system. Such correctors may further include a tertiary hexapole positioned between the second primary hexapole and the particle-optical lens for correcting an eighth-order aberration.

In alternative embodiments of the present disclosure, correctors for correcting axial aberrations of a particle-optical lens may include a first primary hexapole for generating a first primary hexapole field when a first excitation is applied to the first primary hexapole, and a second primary hexapole positioned between the first primary hexapole and the particle-optical lens when the corrector is used within a charged particle microscope system. The second primary hexapole generates a second primary hexapole field when a second excitation is applied to the second primary hexapole, and the first primary hexapole is imaged onto the second primary hexapole in accordance with conventional practice. In such embodiments, the correctors further include a secondary hexapole positioned between the second primary hexapole and the particle-optical lens when the corrector is used within the charged particle microscope system. The secondary hexapole being configured to generate a third hexapole field when a third excitation is applied to the secondary hexapole. The alternative embodiments further include a tertiary hexapole positioned between the second primary hexapole and a particle-optical lens. The tertiary hexapole being configured to generate a fourth hexapole field when a fourth excitation is applied to the tertiary hexapole. The secondary hexapole and the tertiary hexapole are positioned and/or otherwise configured such that the third hexapole field and the fourth hexapole field correct the sixth-order aberration $D_6$. Additionally, correctors according to the present disclosure may include other types of multipoles instead of hexapoles, such as dipoles, quadrupoles, etc. For example, a corrector using quadrupole and octupole fields instead of hexapoles according to the present disclosure may use similar phenomena as discussed above to correct for intrinsic and parasitic high-order aberrations. For example, secondary and tertiary octupole fields can correct for 4-fold aberrations up to order 7.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
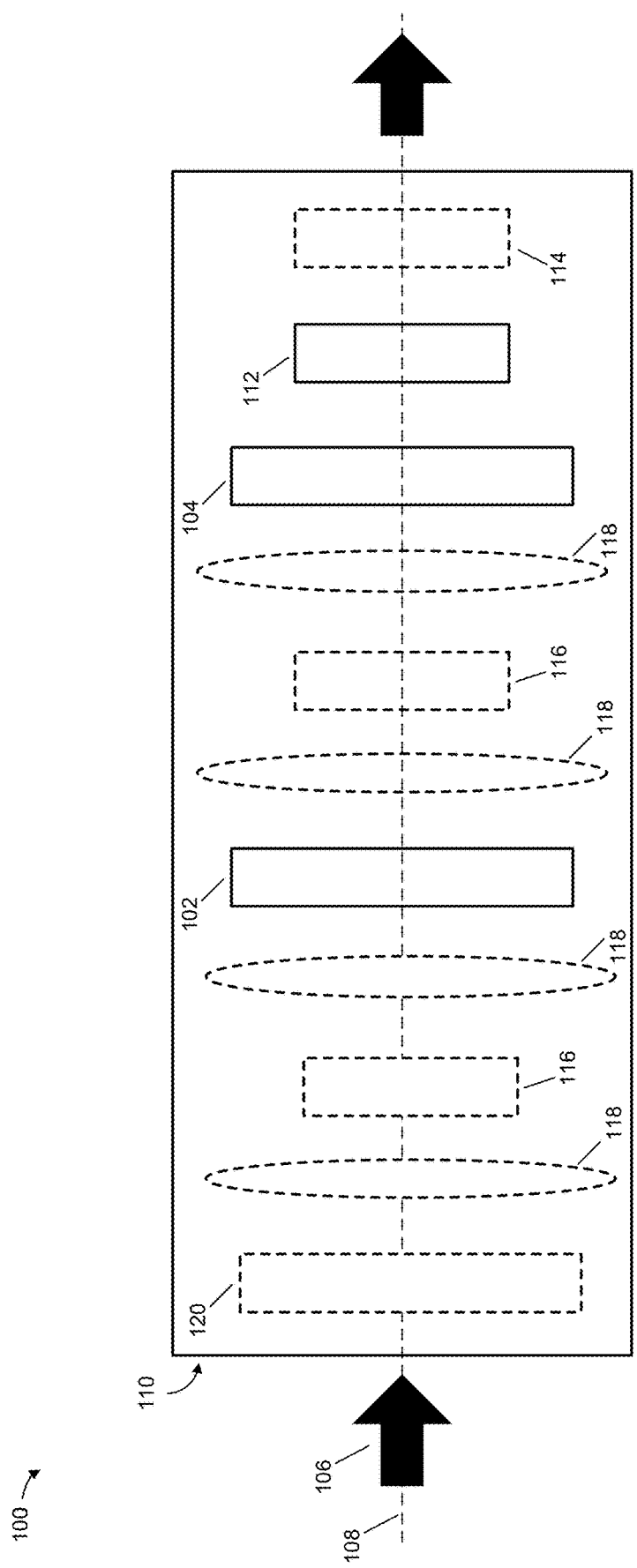
FIG. 1 illustrates example multipole correctors for correcting the sixth-order aberrations and/or above, according to the present invention.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Multipole correctors for correcting the sixth-order aberrations and/or above are included herein. More specifically, the multipole correctors disclosed herein are configured to correct the sixth-order three-lobe $D_6$ aberration in charged particle microscope systems. The multipole correctors according to some embodiments of the present invention include at least a pair of primary multipoles that are not imaged onto each other such that a fourth-order combination aberration is generated, and a secondary multipole that is positioned between the pair of primary multipoles and a lens which is a source of spherical aberration (e.g., the objective lens in the charged particle microscope system) when the corrector is used within a charged particle microscope system.

In some embodiments, the lens may be a lens that is the main source of spherical aberration when the corrector is used within a charged particle microscope system (i.e., the source of the most spherical aberration in the system, a source of a large amount of the spherical aberration in the system). The secondary multipole is configured to correct for the fourth-order aberration and a sixth-order aberration. Correcting an aberration according to the present disclosure corresponds to a positive aberration being counterbalanced by a negative aberration such that their sum is zeroed, substantially zeroed, and/or reduced to an optimal value (e.g., reduced to a value such that their sum combines with one or more other aberrations to balance/correct for higher-order aberrations). Moreover, the terms multipole, quadrupole, hexapole, quadrupole-octupole etc. are used herein to describe multipole fields, quadrupole fields, hexapole fields, quadrupole-octupole fields, etc., and not the physical devices configured to generate those fields.

That is, embodiments of the disclosed invention correct aberration through the novel generation of aberrations that, when combined, correct for sixth-order aberrations. Additionally, as disclosed below, in some embodiments of the disclosed invention the combination of generated aberrations may combine to correct for eighth-order aberrations. Specifically, the pair of primary multipoles that are not imaged onto one another creates a large fourth-order aberration which, when combined with the aberrations created by the novel secondary multipole results in the counterbalancing of both the fourth-order aberration and the sixth-order aberration.

Additionally, the multipole correctors according to some other embodiments of the present invention include at least a pair of primary multipoles that are imaged or substantially imaged onto each other in accordance with conventional practice, and a plurality of multipoles positioned between the pair of primary multipoles and a particle-optical lens when the corrector is used within a charged particle microscope system. The plurality of multipoles are positioned and/or otherwise configured to generate aberrations that combine to correct for sixth-order aberrations or above. That is, individual multipoles positioned between the pair of primary multipoles and the particle-optical lens can be positioned and set to certain excitation levels such that they generate aberrations that combine with other aberrations generated by the corrector system to counterbalance aberrations up to the sixth or eighth-order.

The following treatment demonstrates the performance of example corrector systems according to the present disclosure. Specifically, the following treatment demonstrates the performance of probe hexapole correctors according to the present disclosure that have (i) parallel (or nearly parallel) entrance and exit beams, (ii) identical geometry between primary hexapoles, (iii) only two primary hexapoles, and (iv) have the corrector upstream of the particle-optical lens (as in a SEM or STEM). However, as described below, correctors according to the present disclosure are not limited to such embodiments, but rather correctors having other characteristics (e.g., quadrupole-octupole instead of hexapole, having additional primary hexapoles, for microscope systems other than STEM, designed to be positioned downstream of the specimen from a system's charged particle source, non-parallel exit beams, asymmetric hexapole correctors, asymmetric ray paths, etc.) can be constructed according to the present disclosure which operate according to similar phenomena. For example, where example corrector systems according to the present disclosure are designed to be positioned downstream of the specimen from a system's charged particle source (e.g., a corrector for a TEM system), the arrangement of hexapoles in the corrector are reversed (i.e., the secondary hexapole(s) is are more proximate to the charged particle source than the primary hexapoles, while the second hexapole is still located between the first hexapole and the secondary hexapole(s)).

As example, we treat the case of a corrector with two primary hexapoles in detail. When fringe fields are neglected, the scalar magnetic potential for a hexapole is given by:

$$\psi = \text{Re}[\psi_3 u^3]; \tag{1}$$

Here u=x+iy represents the position (x,y) in the radial direction. We define a complex hexapole excitation parameter k for component hexapoles of embodiments of the present invention as $$k = \frac{3i\eta\overline{\psi_3}}{U_r^{1/2}}, \tag{2}$$

in which $\eta=(e/(2m))^{1/2}$, and $U_r$ is the relativistic potential, e the elemental charge and m the particle's mass. For a two hexapole corrector system we calculate optical properties in the Larmor reference frame, accounting for the rotation of magnetic lenses, in which case we can assume that the values of k for the various hexapole fields are all real. However, in a three hexapole corrector system the individual values of k for the various hexapole fields may be real or imaginary. Moreover, in a plane where the Gaussian beam is parallel, slope aberrations are derived from a phase function $S(u,\overline{u})$ via:

$$\Delta u' = 2\frac{\partial S}{\partial \overline{u}} \tag{3}$$

The phase function accounting for all terms allowed by 3-fold symmetry up to order 7 for the hexapoles of systems disclosed herein are given by:

$$S = \frac{1}{2}C_{1s}u\overline{u} + \frac{1}{4}C_{3s}u^2\overline{u}^2 + \frac{1}{6}C_{5s}u^3\overline{u}^3 + \tag{4}$$
$$\frac{1}{3}A_{2s}Re(\overline{u}^3) + D_{4s}(u^4\overline{u}) + D_{6s}(u^5\overline{u}^2) + \frac{1}{6}A_{5s}Re(\overline{u}^6),$$

where the subscript "s" indicates that the coefficients correspond to slope aberrations. Very small anisotropic values of $A_{5S}$ and $D_{6S}$ aberrations are ignored here (i.e., we assume that all aberration coefficients are real in the Larmor reference frame).

The action of each of the pair of primary hexapoles is approximated by the formulation:

$$\begin{pmatrix} u_{out} \\ u'_{out} \end{pmatrix} = \begin{pmatrix} u_{in} \\ u'_{in} + kL\overline{u}_{in}^2 + \frac{1}{3}k^2L^3 u_{in}^2 \overline{u}_{in} \end{pmatrix}; \tag{5}$$

and the action of the secondary hexapole(s) is approximated by:

$$\begin{pmatrix} u_{out} \\ u'_{out} \end{pmatrix} = \begin{pmatrix} u_{in} \\ u'_{in} + kL\overline{u}_{in}^2 \end{pmatrix}. \tag{6}$$

Here, $u_{in}$ and $u_{out}$ are defined asymptotically in the hexapole mid-plane. In embodiments where a mid-hexapole is located between the pair of primary hexapoles, in order to correct for $A_5$, we ignore its modest effect on $D_6$ in the following calculation. The excitation of the upstream primary hexapole of the pair of primary hexapoles is k, and the excitation parameter of the downstream hexapole of the pair of primary hexapoles is $k+k_2$, where k is far larger than $k_2$. The excitation of the secondary hexapole is $k_3$, which is also far smaller thank.

Figure 2:
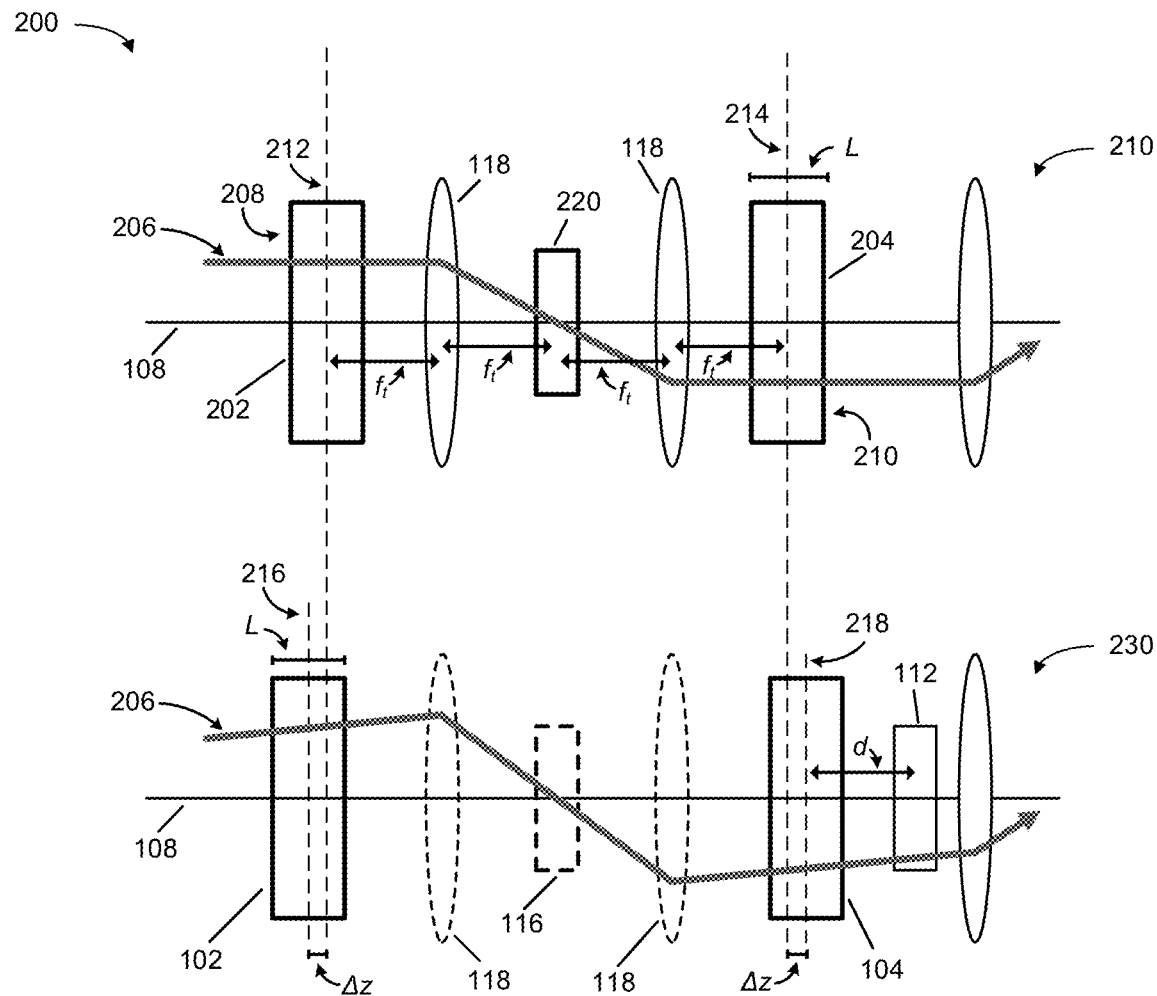
FIG. 2 illustrates a collection of diagrams 200 that illustrate the optical behavior of corrector transfer optics of prior art correctors and sixth-order corrected STEM multipole corrector system according to the present disclosure.

We consider the case that a parallel beam enters the first primary hexapole, and the complex lateral position of an electron in this beam=$u_0$. According to the present invention, the intermediate result ($u_1$, $u_1'$) in the asymptotic mid-plane of the downstream primary hexapole is, up to order 4 in $u_0$:

$$u_1 = -u_0 - 2kL\Delta z\overline{u}_0^2 - \frac{2}{3}k^2L^3\Delta z u_0^2 \overline{u}_0; \tag{7}$$

and $$u_1' = k_2 L\overline{u}_0^2 - \frac{2}{3}k(k+k_2)L^2(L-6\Delta z)u_0^2\overline{u}_0 - \tag{8}$$
$$\frac{2}{3}k(k+k_2)^2 L^4 \Delta z u_0^4 - \frac{4}{3}kk_2(k+k_2)L^4 \Delta z u_0 \overline{u}_0^3.$$

in which the action of the downstream primary hexapole is included, where $\Delta z$ is a physical shift of the primary hexapoles (such as the shift depicted in FIG. 2).

When equation (8) is rewritten in terms of $u_1$, it becomes $$u'_1 = 2\frac{\partial s_1}{\partial \overline{u}_1},$$

with:

$$S_1 = \tag{9}$$
$$\frac{1}{3}k_2 L Re(\overline{u}_1^3) + \left(\frac{1}{6}k(k+k_2)L^3 - k^2L^2\Delta z\right)u_1^2\overline{u}_1^2 + \frac{2}{3}k^3 L^4 \Delta z Re(u_1^4\overline{u}_1),$$

which features the slope aberrations $$A_{2s}^{(2)} = k_2 L; \; c_{3s}^{(1)} = \frac{2}{3}k^2 L^3 + \ldots \; ; D_{4s}^{(1)} = \frac{2}{3}k^3 L^4 \Delta z$$

described in equation (4). In equation (9) the small change in corrector strength $C_{3s}^{(1)}$ due to $k_2$ and $\Delta z$ is ignored, and $C_{3s}^{(1)}$ is set to equal $\frac{2}{3}k^2L^3$ in the remainder. From here, there are two ways to proceed with the calculation, in order to show that corresponding embodiments of the disclosed invention correct for sixth-order (and in some cases eighth-order or higher) aberrations.

In the first method, with the drift distance between the downstream primary hexapole and the second hexapole equal to d, the action of the secondary hexapole is $k_3$, and a back-extrapolation is applied to the center of the downstream primary hexapole. This results in the relationship:

$$\begin{pmatrix} u_2 \\ u'_2 \end{pmatrix} = \begin{pmatrix} 1 & -d \\ 0 & 1 \end{pmatrix} \begin{pmatrix} u_1 + du'_1 \\ u'_1 + A_{2s}^{(3)}(\overline{u}_1 + d\overline{u}'_1)^2 \end{pmatrix} = \begin{pmatrix} u_1 - dA_{2s}^{(3)}(\overline{u}_1 + d\overline{u}'_1)^2 \\ u'_1 + A_{2s}^{(3)}(\overline{u}_1 + d\overline{u}'_1)^2 \end{pmatrix} \tag{10}$$

in which $A_{2s}^{(3)} = k_3 L_3$, and $u'_1 = A_{2s}^{(2)}\overline{u}_1^2 + C_{3s}^{(1)}u_1^2\overline{u}_1 + A_{2s}^{(2)}(u_1^4 + 4u_1\overline{u}_1^3)$.

A Taylor series inversion of $(u_1, \overline{u}_r)$ allows $u'_2$ to be written as a function of $(u_2, \overline{u}_2)$, which results in the relationship $$u'_2 = 2\frac{\partial s_2}{\partial \overline{u}_2},$$

wherein:

$$S_2 = \frac{1}{3}(A_{2s}^{(2)} + A_{2s}^{(3)})Re(\overline{u}_2^3) + \frac{1}{4}C_{3s}^{(1)}u_2^2\overline{u}_2^2 + \tag{11}$$
$$(D_{4s}^{(1)} + dC_{3s}^{(1)}A_{2s}^{(3)})Re(u_2^4\overline{u}_2) + d^2[C_{3s}^{(1)}]^2 A_{2s}^{(3)} Re(u_2^5\overline{u}_2^2).$$

Therefore, the three-fold aberration coefficients for embodiments of the present invention can be written as:

$$A_{2s} = A_{2s}^{(2)} + A_{2s}^{(2)}; \tag{12}$$

$$D_{4s} = D_{4s}^{(1)} + d\;C_{3s}^{(1)} A_{2s}^{(3)}; \text{ and} \tag{13}$$

$$D_{6s} = D_{6s,cor} + d^2[C_{3s}^{(1)}]^2 A_{2s}^{(3)}; \tag{14}$$

where $D_{6s,cor}$ is the intrinsic corrector aberration for a corrector having no mechanical and/or electrical errors. Using equations (12) and (13), it can then be shown that $A_{2s}$ and $D_{4s}$ are each equal to 0 when $k_2 L = -k_3 L_3$ and $\Delta z = k_2 d/k$.

When the sixth-order spherical aberration $D_{6s}$ is rewritten with these values we find that:

$$D_{6s}^{(3)} = D_{6s,cor}^{(2)} + \frac{4}{9}dk^5 L^7 \Delta z = D_{6s,cor} - \sqrt{\frac{3}{2}} dL^{-1/2}[C_{3s}^{(1)}]^{5/2}\Delta z. \tag{15}$$

Equation (15) can be translated into the position aberration:

$$D_6 = D_{6,cor} - \sqrt{\frac{3}{2}} dL^{-1/2} C_3^{5/2} f_{eff}^{-3}\Delta z, \tag{16}$$

at the specimen, in which $C_3 \approx C_{3,obj}$ is the spherical aberration of the lenses outside the corrector, which is dominated by the spherical aberration of the objective lens ($C_{3,obj}$), and $f_{eff}$ is the effective focal distance of the transfer lenses and the objective lens. The relationships for the effective focal distance is:

$$f_{eff} = \frac{x}{\alpha}, \tag{16.1}$$

where x is the position in the corrector exit plane and a is the corresponding angle in the specimen plane.

Using these relationships, correctors according to the present disclosure can be constructed that correct for the sixth-order three-lobe $D_6$ aberration in charged particle microscope systems. That is, correctors with a secondary multipole hexapole downstream of the pair of primary hexapoles can be positioned and/or otherwise configured such that the correctors correct for sixth-order aberrations. For example, where $D_{6,cor}$ is equal to 3 mm, the above relationships show that the aberrations $A_{2s}$, $D_{4s}$, and $D_{6s}$ may be corrected with a hexapole shift $\Delta z = 0.5$ mm, where L=16 mm, $C_3=1.4$ mm, d=35 mm, and $f_{eff}=1.6$ mm. As will be discussed further below, the hexapole shift $\Delta z$ may be achieved by a physical displacement of the pair of primary hexapoles such that they are not imaged onto each other, or by a change of excitations of the two transfer lenses between the primary hexapoles such that the pair of primary hexapoles are not imaged onto each other, or a combination thereof.

In the second method to proceed from equations (1) through (9) to equations (12,13,14), a probe corrector with a parallel beam in the exit plane and with a number of multipoles which are treated in the thin lens approximation is considered. In the free space downstream of the corrector, the phase function $(S(x,y,z))$ is governed by the eikonal equation described as equation 2.21 in Harald Rose: Geometrical Charged-Particle Optics, Springer, 2009, where potential is constant, and vector potential is zero. Thus, the phase function in this free space, scaled such that $\vec{\nabla} S \cdot \vec{\nabla} S = 1$, can be written as:

$$\frac{\partial s}{\partial z} = -1 + \sqrt{1 - \frac{\partial s^2}{\partial x} - \frac{\partial s^2}{\partial y}} \approx -\frac{1}{2}\left[\frac{\partial s^2}{\partial x} + \frac{\partial s^2}{\partial y}\right] \tag{17}$$

and the corresponding ray slopes can be written as:

$$\frac{dx}{dr} = \frac{x'}{\sqrt{1 + x'^2 + y'^2}} = \frac{\partial s}{\partial x}, \quad (18)$$

and $$\frac{dy}{dr} = \frac{y'}{\sqrt{1 + x'^2 + y'^2}} = \frac{\partial s}{\partial y}. \quad (19)$$

On the right-hand side of equation 17, a term −1 is added in order to get rid of the uninteresting component S=z. The phase function S(x,y,z) is expanded in a series like equation (4), with z-dependent aberration coefficients, e.g. $A_{2s}=A_{2s}(z)$. Equation (17) can thus be rewritten as a set of non-linear differential equations for these coefficients (e.g., $C_{3s}(z)'=-2A_{2s}(z)^2$ and $D_{4s}(z)'=-A_{2s}(z)C_{3s}(z)$). Using these differential equations to propagate the coefficients $A_{2s}^{(2)}$, $C_{3s}^{(1)}$, $D_{4s}^{(1)}$ discussed above over a drift distance $d_1$, starting from equation 9, and then extrapolated back to the corrector exit plane (i.e., propagate the coefficients over $d_1$ using the reverse of equation (17) corresponding to $C_{3s}(z)'=2A(z)^2$ and $D_{4s}(z)'=A_{2s}(z)C_{3s}(z)$ for example) to obtain the following three-fold aberrations:

$$A_{2s}=A_{2s}^{(2)}+A_{2s}^{(3)}; \quad (20)$$

$$D_{4s}=D_{4s}^{(1)}+d_1 C_{3s}^{(1)} A_{2s}^{(3)}; \quad (21)$$

$$D_{6s}=D_{6s,cor}+d_1^2 [C_{3s}^{(1)}]^2 A_{2s}^{(3)}; \text{ and} \quad (22)$$

$$D_{8s}+D_{8s,cor}+\tfrac{1}{3}d_1^3 [C_{3s}^{(1)}]^3 A_{2s}^{(3)}. \quad (3)$$

$$D_{8s}=D_{8s,cor}+\tfrac{1}{3}d_1^3 [C_{3s}^{(1)}]^3 A_{2s}^{(3)}. \quad (23)$$

Here, $D_{6s,cor}$ and $D_{8s,cor}$ are the intrinsic corrector aberrations. In some embodiments of corrector systems according to the present invention $d_1$ corresponds to the distance between a most downstream primary multipole of the corrector and a secondary multipole downstream of the corrector.

Using relationships (20) through (22), correctors according to the present disclosure can be constructed that correct for the sixth-order three-lobe aberrations in charged particle microscope systems. That is, because the relationships (20) through (22) include three degrees of freedom (i.e., delta-excitation $k_2$ causing $A_{2s}^{(2)}$, excitation $k_3$ causing $A_{2s}^{(3s)}$, and $\Delta z$ causing $D_{4s}^{(1)}$). These three degrees of freedom allow for the corrector systems according to the present disclosure to be designed with the pair of primary hexapoles having a certain hexapole shift and including one or more secondary hexapoles downstream of the pair of primary hexapoles positioned and/or otherwise configured so that the combined aberrations of the corrector system achieves $A_{2s}=D_{4s}=D_{6s}=0$ (i.e., the correction of the second, fourth, and sixth-order three lobe aberrations).

Figure 9:
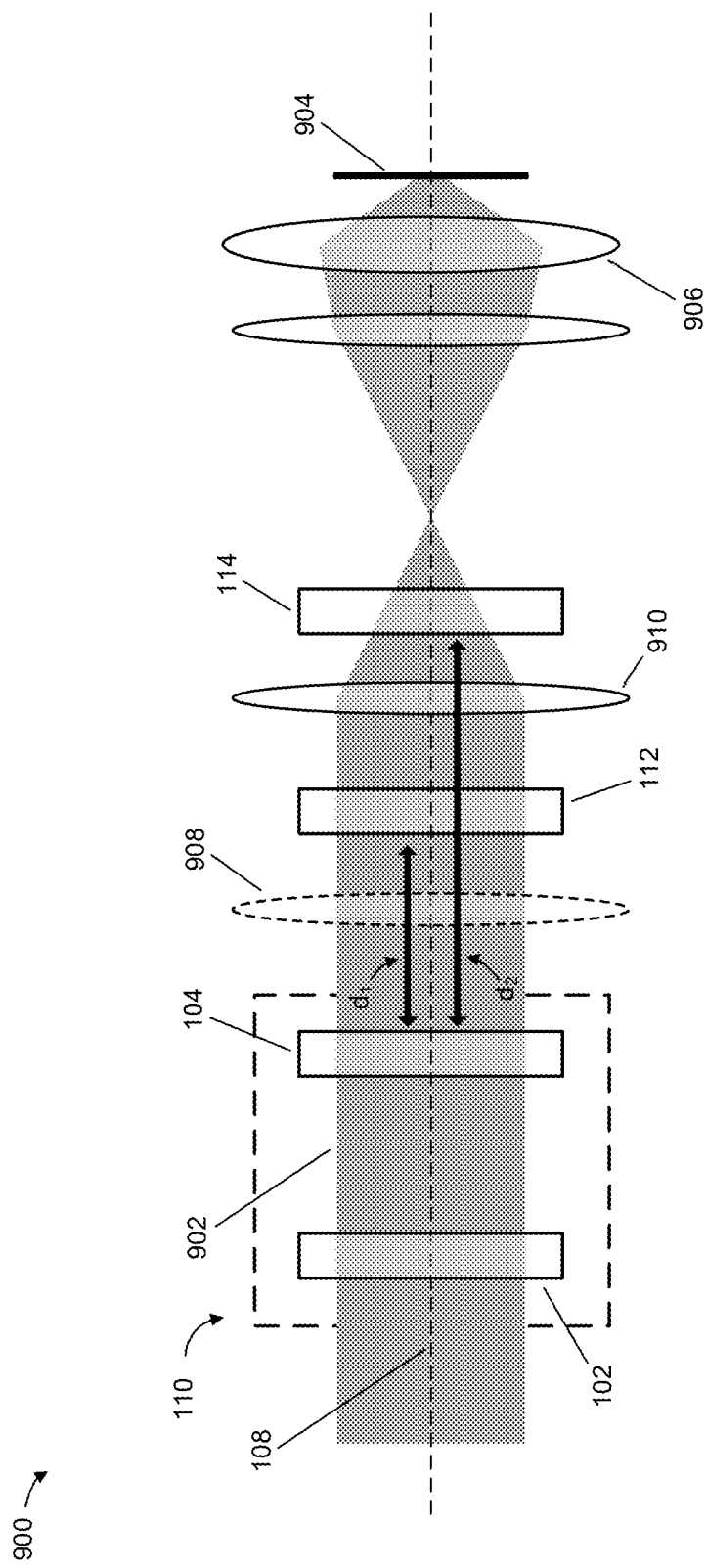
FIG. 9 illustrates example multipole corrector systems for correcting the sixth-order aberration including at least a pair of primary multipoles that are imaged onto each other, and a plurality of multipoles positioned downstream of the pair of primary multipoles that are positioned and/or otherwise configured to generate aberrations that combine to correct for sixth-order aberrations or above.

Additionally, in some embodiments, the corrector systems according to the present invention may include a plurality of secondary multipoles between the primary pair of multipoles and an objective lens when the corrector system is used within a charged particle microscope. For example, a corrector system may include a first secondary multipole downstream of the pair of primary multipoles, and a second secondary multipole downstream of the first secondary multipole. To determine the three-fold aberrations for such a system, the process of using equation (17) to propagate the coefficients $A_{2s}^{(2)}$, $C_{3s}^{(1)}$, $D_{4s}^{(1)}$ and then extrapolating back to the corrector exit plane using the reverse of equation (17) can be conducted twice. In the first iteration, these two calculations can be performed over a drift distance $d_1$ associated with the first secondary multipole, and in the second iteration of the calculations can be performed over a drift distance $d_2$ associated with the second secondary multipole. An example visualization of this process is illustrated in FIG. 9. Additionally, it is noted that the treatment below corresponds to the special case where the lens 908 and 910 (in FIG. 9) are not excited. In other cases, the principles remain the same, but the analytical calculations are different. Such a double iteration of this process results in the following three-fold aberrations for the corrector system:

$$A_{2s}=A_{2s}^{(2)}+A_{2s}^{(3)}+A_{2s}^{(4)}; \quad (24)$$

$$D_{4s}=D_{4s}^{(1)}+d_1 C_{3s}^{(1)} A_{2s}^{(3)}+d_2 C_{3s}^{(1)} A_{2s}^{(4)}; \quad (25)$$

$$D_{6s}=D_{6s,cor}+d_1^2 [C_{3s}^{(1)}]^2 A_{2s}^{(3)}+d_2^2 [C_{3s}^{(1)}]^2 A_{2s}^{(4)}; \text{ and} \quad (26)$$

$$D_{8s}=D_{8s,cor}+\tfrac{1}{3}d_1^3 [C_{3s}^{(1)}]^3 A_{2s}^{(3)}+\tfrac{1}{3}d_2^3 [C_{3s}^{(1)}]^3 A_{2s}^{(4)}. \quad (27)$$

These relationships show that corrector systems according to the present disclosure can be designed with the pair of primary hexapoles having a certain hexapole shift and including two or more secondary hexapoles downstream of the pair of primary hexapoles that are positioned and/or otherwise configured so that the combined aberrations of the corrector system achieves $A_{2s}=D_{4s}=D_{6s}=D_{8s}=0$ (i.e., the correction of the second, fourth, sixth, and eighth-order three lobe aberrations).

Alternatively, using these relationships for the three-fold aberrations of such a corrector system, corrector systems according to the present disclosure can be constructed that have the pair of primary multipoles imaged onto each other while still correcting for the sixth-order three lobe aberrations. This has the advantage that second-order off-axial astigmatism is smaller compared to embodiments where not all primary hexapoles are imaged onto each other. In this case, $D_{4s}^{(1)}=0$, i.e. this is no longer a degree of freedom. The relationships (24) through (26) allow for such three lobe aberrations to be corrected when the pair of primary multipoles are imaged onto each other. This is because relationships (24) through (26) have three degrees of freedom (i.e. the hexapole excitations causing $A_{2s}^{(2)}$, $A_{2s}^{(3)}$, $A_{2s}^{(4)}$), allowing such corrector systems to be designed (i.e., have two secondary multipoles downstream of the pair of primary multipoles that are specifically positioned and/or configured) such that three-fold aberrations up to the sixth-order can be corrected without relying on the hexapole shift as an additional variable (i.e., $A_{2s}=D_{4s}=D_{6s}=0$).

FIG. 1 is an illustration of example multipole correctors 100 for correcting the sixth-order aberrations and/or above, according to the present invention. The description and arrows in FIG. 1 are specific for a probe corrector in a SEM or STEM system. Example multipole correctors 100 include at least a first primary multipole 102 and a second primary multipole 104. A multipole is an optical element for generating an electromagnetic field showing n/2-fold rotational symmetry, where n is an even integer. Thus, examples of multipoles include dipoles, quadrupoles, hexapoles, etc. For example, a multipole with 8 yokes/electrodes can generate dipole fields, quadrupole fields, and hexapole fields, in any orientation.

During operation of the SEM or STEM system, a charged particle beam 106 is directed along a central axis 108 toward a first end 110 of the multipole corrector. The second primary multipole 104 is located between the first primary multipole 102 and a particle-optical lens when the corrector is used within a charged particle microscope system. For example, the second primary multipole 104 is shown in FIG. 1 as being located downstream of the first primary multipole 102 (i.e., the charged particle beam 106 interacts with the first primary multipole 102 before it interacts with the second primary multipole 104). An excitation is applied to each of the first primary multipole 102 and the second primary multipole 104 such that they generate an electromagnetic field that directs the charged particle beam 106 so that is incident upon a specimen. In embodiments where the corrector 100 is designed for operation within a TEM system, the corrector 100 would be positioned downstream of the sample, and the charged particle beam 108 would interact with the second primary multipole 104 before interacting with the first primary multipole 102.

According to the present invention, the contributions of the first primary multipole 102, the second primary multipole 104, and the transfer optics in between produce a significant 3-fold astigmatism $A_2$ and a significant fourth-order 3-lobe aberration $D_4$. In various embodiments, this failure to nullify $A_2$ and $D_4$ may be a result of the excitation applied to the second primary multipole 104 being greater than the excitation applied to the first primary multipole 102, the first primary multipole 102 and the second primary multipole 104 having different lengths (i.e., $L_1$ and $L_2$), the first primary multipole 102 and the second primary multipole 104 having a different beam radius, the first primary multipole 102 and the second primary multipole 104 having different dimensions of the magnetic yoke, asymmetry of the transfer lenses 118 between first primary multipole 102 and the second primary multipole 104, asymmetry of the ray paths of the charged particle beam 106 between first primary multipole 102 and the second primary multipole 104, the transfer optics between the primary multipoles being exited such that the multipoles are not imaged onto each other, or a combination thereof. Instead, according to the present invention, one or more of these aspects of the correctors described herein are adjusted and/or adopted such that sixth-order aberrations and/or above are corrected. As used herein, the term "excitation" as applied to a multipole refers to an excitation voltage or an excitation current being applied to the corresponding multipole. For example, in an embodiment where the corrector 100 is being used in an electron microscope column, the excitation may refer to a current that is applied to a particular multipole which causes the particular multipole to generate a multipole field.

In prior art correctors 100, the component multipoles are imaged onto each other to prevent an aberration. However, in the example multipole correctors 100 for correcting sixth-order aberrations and/or above the first primary multipole 102 is not imaged onto the second primary multipole 104 such that a combination aberration is created. For example, where the first primary multipole 102 and the second primary multipole 104 are each hexapoles, this would create a large fourth-order aberration. In some embodiments, the first primary multipole 102 not being imaged onto the second primary multipole 104 corresponds to one or more of the multipole midplane of the first primary multipole 102 and the multipole midplane of the second primary multipole 104 being displaced along the central axis 108. For example, each of the first primary multipole 102 and the second primary multipole 104 can be displaced as much as 0.1 mm, 0.5 mm, 1 mm, 0.1%, 0.5%, 1% of the distance between the two primary multipoles or more in opposite directions along the central axis 108. In addition, the charged particle beam 106 may enter the first primary multipole 102 at a non-parallel angle with the central axis 108. For example, excitations may be applied to one or more lenses upstream of an example multipole corrector 100 such that the one or more lenses cause the charged particle beam to enter the first primary multipole 102 at a non-parallel angle with the central axis 108.

FIG. 1 further shows the example multipole correctors 100 as including a secondary multipole 112 positioned between the second primary multipole 104 and a particle-optical lens when the corrector is used within a charged particle microscope system (e.g., downstream of the second primary multipole 104 in a SEM/STEM system, and upstream of the second primary multipole 104 in a TEM system). The secondary multipole 112 is positioned, excited, and/or otherwise configured so that a multipole field generated by the secondary multipole 112 corrects (i) the aberration created by the first primary multipole 102 not being imaged onto the second primary multipole 104 and (ii) a higher-order aberration. For example, where the secondary multipole 112 is a hexapole, it is positioned, excited, and/or otherwise configured so that a multipole field generated by the secondary multipole 112 corrects (i) a fourth-order aberration created by the first primary multipole 102 not being imaged onto the second primary multipole 104 and (ii) a sixth-order aberration.

For example, the change in excitation between the first and second multipoles 102 and 104 acts as a first degree of freedom, the shift $\Delta z$ acts as a second degree of freedom (that results in a $D_4$ aberration that scales linearly with the shift), and the excitation of the secondary multipole 112 acts as a third degree of freedom. By adjusting these values, the example multipole correctors 100 are able to generate controlled $A_2$ and $D_4$ aberrations (i.e., $A_2$ is dependent on the excitation value of the secondary multipole 112 and the change in excitation between the first and second multipole 102 and 104, and $D_4$ is dependent on the excitation value of the secondary multipole 112 and the shift). Adjusting the values also allows that an additional aberration dependent upon the excitation value of the secondary multipole 112 is generated that when combined with $D_{6,cor}$ corrects for the $D_6$ aberration of the system. In this way, these values for the example multipole correctors 100 are such that the second, fourth, and sixth-order aberrations are corrected.

In this way, during operation of such a charged particle microscope, when the example multipole corrector 100 comprises hexapoles, the example multipole corrector 100 corrects the sixth-order three lobe $D_6$ aberration. In some embodiments, the example multipole correctors 100 may optionally include a tertiary multipole 114 positioned between the secondary multipole 112 and a particle-optical lens when the corrector is used within a charged particle microscope system. Such a tertiary multipole 114 is positioned, excited, and/or otherwise configured so that a multipole field generated by the tertiary multipole 114 corrects even higher-order aberrations (e.g., where the tertiary multipole 114 is a hexapole, it may correct for eighth-order aberrations).

According to the present disclosure, the contributions to the three-fold astigmatism $A_2$ by the first primary hexapole 102, the second primary hexapole 104, the secondary multipole 112, and the optional tertiary multipole 114 collectively add up to zero.

In some embodiments, example multipole correctors 100 may include an intermediate multipole 116 and/or one or more transfer lenses 118. Additionally, while not illustrated in FIG. 1, example multipole correctors 100 may also optionally include a third primary multipole. Such a third primary multipole may be located upstream of the first multipole 102, downstream from the second multipole 104, or between the first multipole 102 and the second multipole 104. In some embodiments, each of the generated hexapole fields have the same orientation in the xy-plane, in the Larmor reference frame. Alternatively, in other embodiments one or more of the generated hexapole fields may not be in the same orientation in the xy-plane and/or in the xy-plane.

In FIG. 1, multipole corrector 100 is illustrated as being a box comprising a plurality of optical components (i.e., multipoles and lenses). In various embodiments, these optical components may be encased or partially encased by a protective and/or supporting structure. Additionally, in embodiments including such a structure, one or more of the optical components may be not within the structure. FIG. 1 also shows at least one additional primary multipole 120. Individual multipoles of the at least one additional primary multiple 102 may be positioned upstream from the first primary multipole 102, downstream from the second primary multipole 104, between the first primary multipole 102 and the second primary multipole 104, or a combination thereof.

FIG. 2 is a collection of diagrams 200 that illustrate the optical behavior of corrector transfer optics of prior art correctors and sixth-order corrected STEM multipole corrector system according to the present disclosure. Specifically, diagrams 210 and 230 illustrate the optical behavior for considering aberrations present in prior art correctors, and sixth-order corrected STEM multipole corrector 100, respectively.

Diagram 210 shows a general scheme for a prior art corrector where a first primary hexapole 202 is imaged onto a second primary hexapole 204. Each of diagrams 210 and 230 show axial rays 206 of the charged particle beam 106 in the xz plane, where the z axis corresponds to the central axis 108 of the example multipole corrector 100. Diagram 210 shows the axial ray 206 of the charged particle beam 206 as being parallel to the central axis 108 when it enters the entrance plane 208 of the first hexapole 202 and when it leaves the exit plane 210 of the second hexapole 204. Diagram 210 further shows the multipole midplane of the first hexapole 202 being in a position 212 and the multipole midplane of the second hexapole 204 being in a position 214 such that the first hexapole 202 is imaged onto the second hexapole 204.

Diagram 230 shows an embodiment of the sixth-order corrected STEM multipole corrector system in which the first primary hexapole 202 and the second primary hexapole 204 are both mechanically shifted Δz along the central axis 108 from their standard positions (i.e., positions where the first hexapole 202 is imaged onto the second hexapole 204, such as shown in diagram 230). That is, diagram 230 shows the multipole midplane of the first primary hexapole 102 in a position 216 and the multipole midplane of the second primary hexapole 104 in a position 218. However, as noted above, in other embodiments only one of the primary multipoles may be shifted. Alternatively, or in addition, as discussed above the shift Δz may also be created or supplemented effectively by adjusting the transfer lenses 118, optionally combined with an excitation change of one or more optical elements upstream of the sixth-order corrected STEM multipole corrector system such that the charged particle beam 206 enters the first primary hexapole 102 at a non-parallel angle with the central axis 108. In such embodiments, either the first primary hexapole 202, the second primary hexapole 204, or both may not be mechanically shifted from traditional primary hexapole positions in conventional practice.

FIG. 2 further illustrates the corrector system of diagram 230 as including a secondary multipole 112 that is positioned downstream of the second primary hexapole 104. Each of the first hexapole 102, second primary multipole 104, and the secondary hexapole 112 are positioned and each excited by corresponding excitations such that the aberrations generated by the sixth-order corrected STEM multipole corrector system depicted in diagram 230 combine to correct aberrations up to at least the sixth-order.

Figure 3:
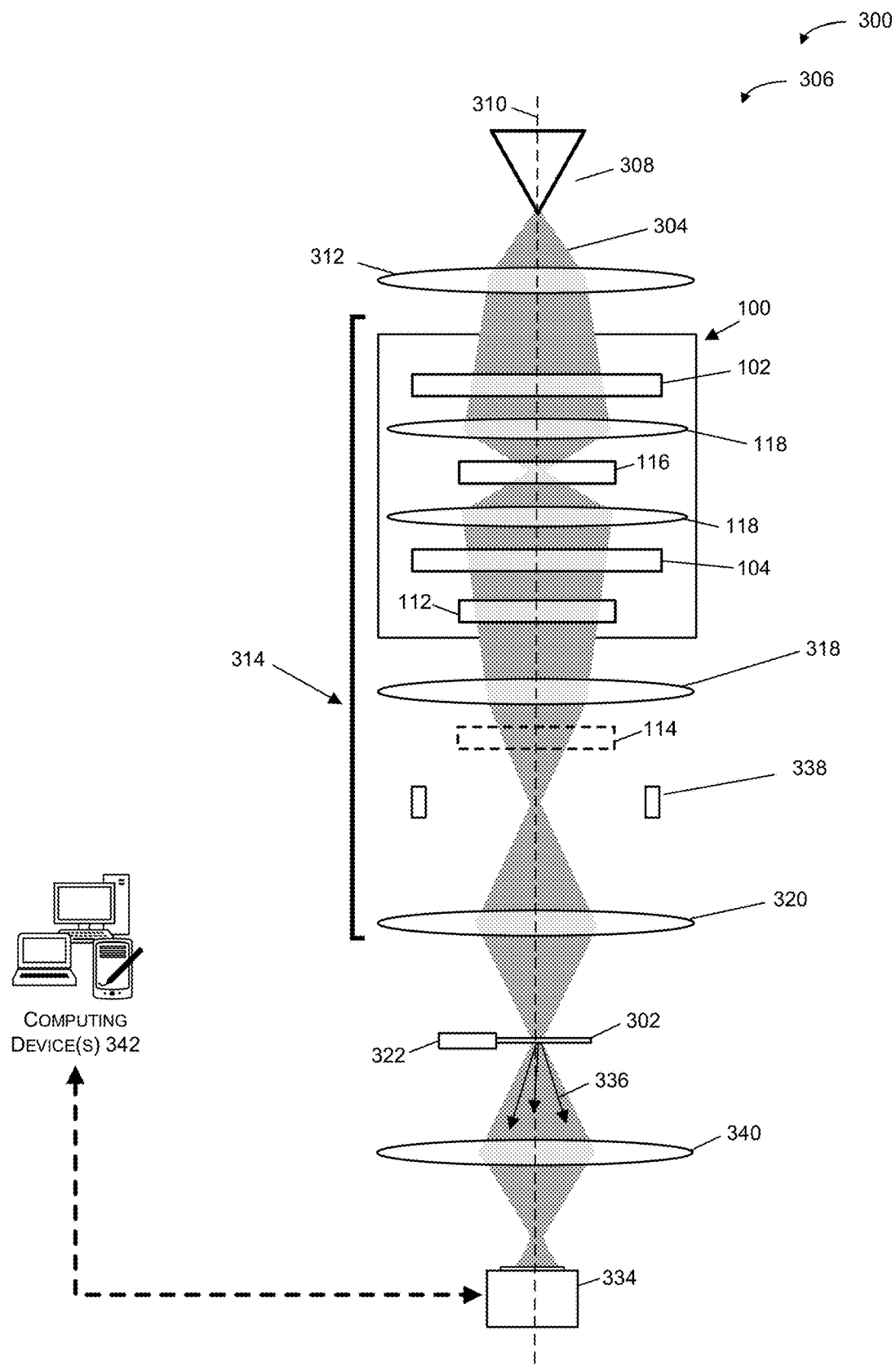
FIG. 3 illustrates an example charged particle microscope system for inspection of a component of a sample 302 whose optical column includes a sixth-order corrected STEM multipole corrector system 100 according to the present invention.

FIG. 3 is an illustration of example charged particle microscope system(s) 300 for inspection of a component of a sample 302 whose optical column includes a sixth-order corrected STEM multipole corrector system 100 according to the present invention. That is, FIG. 3 illustrates charged particle microscope system(s) 300 that include a STEM multipole corrector system 100 that comprises hexapoles as the component multipoles. The example charged particle microscope system(s) 300 may include electron microscope (EM) setups or electron lithography setups that are configured to irradiate and/or otherwise impinge the sample 302 with a beam of electrically charged particles 304 (usually an electron beam or an ion beam). In various embodiments the charged particle microscope system 300 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc. Additionally, in some embodiments a TEM is capable of operating as a STEM as well. FIG. 3 shows the example charged particle microscope system(s) 300 as being a STEM system 306.

The example charged particle microscope system(s) 300 includes a charged particle source 308 (e.g., a thermal electron source, Schottky-emission source, field emission source, a liquid metal ion source, a plasma ion source, etc.) that emits the charged particle beam 304 along an emission axis 310 and towards an accelerator lens 312. The emission axis 310 is a central axis that runs along the length of the example charged particle microscope system(s) 300 from the charged particle source 308 and through the sample 302.

The accelerator lens 312 accelerates/decelerates, focuses, and/or directs the charged particle beam 304 towards a focusing column 314. The focusing column 314 focuses the charged particle beam 304 so that it is incident on sample 302. Additionally, the focusing column 314 corrects and/or tunes aberrations (e.g., geometric aberrations, chromatic aberrations) of the charged particle beam 304. In FIG. 3, the focusing column 314 is illustrated as including the sixth-order corrected STEM multipole corrector system 100 according to the present invention, a transfer lens 318, and an objective lens 320. The sixth-order corrected STEM multipole corrector system 100 includes a first primary multipole 102 and a second primary multipole 104 that are not imaged onto each other. The sixth-order corrected STEM multipole corrector system 100 also is shown as including a secondary multipole 112 positioned and/or otherwise configured so that it generates aberrations that combine with the other aberrations generated by the first primary multipole 102 and the second primary multipole 104 to correct for three-fold aberrations up to the sixth-order. FIG. 3 also illustrates the sixth-order corrected STEM multipole corrector system 100 as including an intermediate multipole 116 and a pair of transfer lenses 118.

The objective lens 320 is an optical element that focuses the charged particle beam 304 to a point on the sample 302. The objective lens 320 may comprise a single-polepiece lens, a magnetic electrostatic compound lens, electrostatic detector objective lens, or another type of objective lens.

FIG. 3 further illustrates the example charged particle microscope system(s) 300 as including a sample holder 322 that holds the sample 302. The example charged particle microscope system(s) 300 is also shown as including a detector 334 that is configured to detect charged particles 336 that pass through the sample 302 as a result of the charged particle beam 304 being incident on the sample 302. In addition, the example charged particle microscope system(s) 300 is illustrated as including astigmatism correction and scan coils 338 for causing the charged particle beam 304 to scan the surface of the sample 302. For example, by operating scan coils 338, the direction of the charged particle beam 304 may be shifted so that it strikes a different location of the sample 302. The example charged particle microscope system(s) 300 further includes one or more projection lenses 340 positioned between the sample 302 and the detector 334.

FIG. 3 further shows example charged particle microscope system(s) 300 as optionally including a computing device(s) 342. Those skilled in the art will appreciate that the computing devices 342 depicted in FIG. 3 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 342 may also be connected to other devices that are not illustrated, or instead may operate as a stand-alone system.

Figure 4:
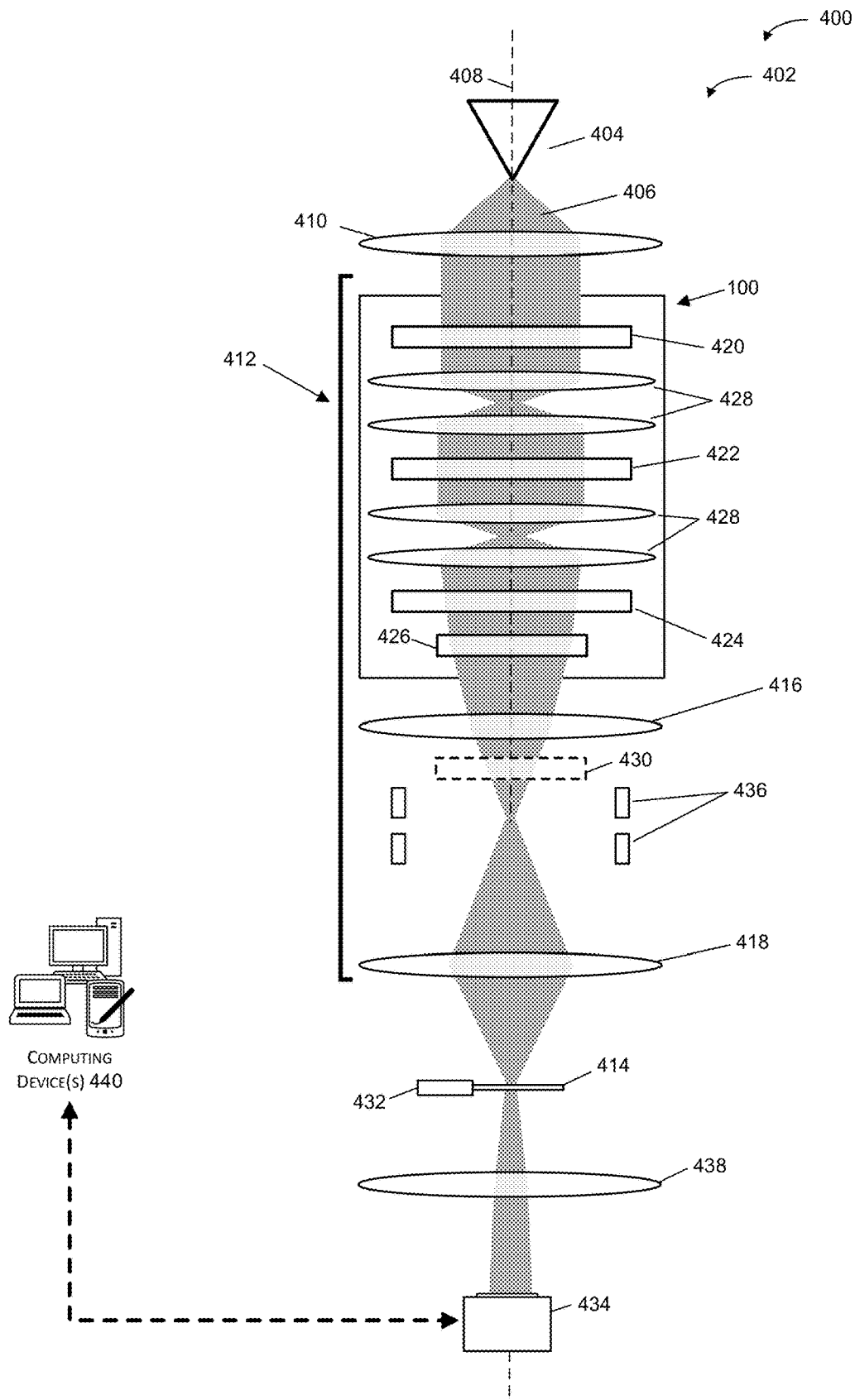
FIG. 4 illustrates an example charged particle microscope system including a sixth-order corrected STEM multipole corrector system 100 having three primary multipoles, where at least two of the primary multipoles are not imaged onto each other.

FIG. 4 shows an example charged particle microscope system(s) 400 including a sixth-order corrected STEM multipole corrector system 100 having three primary multipoles, where at least one of the primary multipoles is shifted from its conventional position (via a physical translation and/or other adjustments described herein), such that a large fourth-order aberration is generated. That is, FIG. 4 illustrates charged particle microscope system(s) 400 that include a STEM multipole corrector system 100 that comprises hexapoles as the component multipoles.

The example charged particle microscope system(s) 400 includes a charged particle source 404 that emits the charged particle beam 406 along an emission axis 408 and towards an accelerator lens 410. The accelerator lens 410 accelerates/decelerates, focuses, and/or directs the charged particle beam 406 towards a focusing column 412 configured to focus the charged particle beam 406 so that it is incident on sample 414. Additionally, the focusing column 412 corrects and/or tunes aberrations (e.g., geometric aberrations, chromatic aberrations) of the charged particle beam 416.

In FIG. 4, the focusing column 412 is illustrated as including the sixth-order corrected STEM multipole corrector system 100 according to the present invention, a transfer lens 416, and an objective lens 418. The sixth-order corrected STEM multipole corrector system 100 illustrated in FIG. 4 comprises three primary multipoles (i.e., a first primary multipole 420, a second primary multipole 422, and a third primary multipole 424), where at least two of the primary multipoles are not imaged onto each other. Specifically, in FIG. 4 the second primary multipole 422 not being imaged onto the third primary multipole 424. However, in other embodiments, any other pairing of the three primary multipoles may not be imaged onto each other. The sixth-order corrected STEM multipole corrector system 100 also is shown as including a secondary multipole 426 positioned and/or otherwise configured so that it generates aberrations that combine with the other aberrations generated by the first primary multipole 420, the second primary multipole 422, and the third primary multipole 424 to correct for three-fold aberrations up to the sixth-order. In embodiments where the three primary hexapoles do not have identical orientations in the Larmor reference frame, their mutual imaging conditions have to be tuned such that the resulting complex aberration coefficient $D_4$ has the same phase as $D_{6,cor}$, i.e. $D_4/D_{6,cor} = (D_{4r} + i D_{4i})/(D_{6r,cor} + i D_{6i,cor})$=real-valued. FIG. 4 also illustrates the sixth-order corrected STEM multipole corrector system 100 as including optional pairs of transfer lenses 428 and an optional tertiary multiple 430. In embodiments including the tertiary multiple 430, the tertiary multipole 430 can be positioned and/or excited such that it generates aberrations that combine with the cumulative aberrations generated by other multipoles of the sixth-order corrected STEM multipole corrector system 100 to correct eighth-order aberrations, provided that $D_{6,cor}/D_{8,cor}$ is close to real-valued, and primary hexapole $D_4$ is tuned such that $D_4/D_{6,cor}$=real-valued. FIG. 4 illustrates the transfer lens 416 as being located between the secondary multipole 426 and the tertiary multipole 430, however in other embodiments the transfer lens 416 may be positioned between the third primary multipole 424 and the secondary multiple 426 or downstream of the tertiary multipole 430.

FIG. 4 further illustrates the example charged particle microscope system(s) 400 as including a sample holder 432 that holds the sample 414. The example charged particle microscope system(s) 400 is also shown as including a detector 434 that is configured to detect charged particles that pass through the sample 414 as a result of the charged particle beam 406 being incident on the sample 414. In addition, the example charged particle microscope system(s) 400 is illustrated as including astigmatism correction and scan coils 436 for causing the charged particle beam 406 to scan the surface of the sample 414.

For example, by operating scan coils 436, the direction of the charged particle beam 416 may be shifted so that it strikes a different location of the sample 414. The example charged particle microscope system(s) 400 further includes one or more projection lenses 438 positioned between the sample 414 and the detector 434. FIG. 4 further shows example charged particle microscope system(s) 400 as optionally including a computing device(s) 440.

Figure 5:
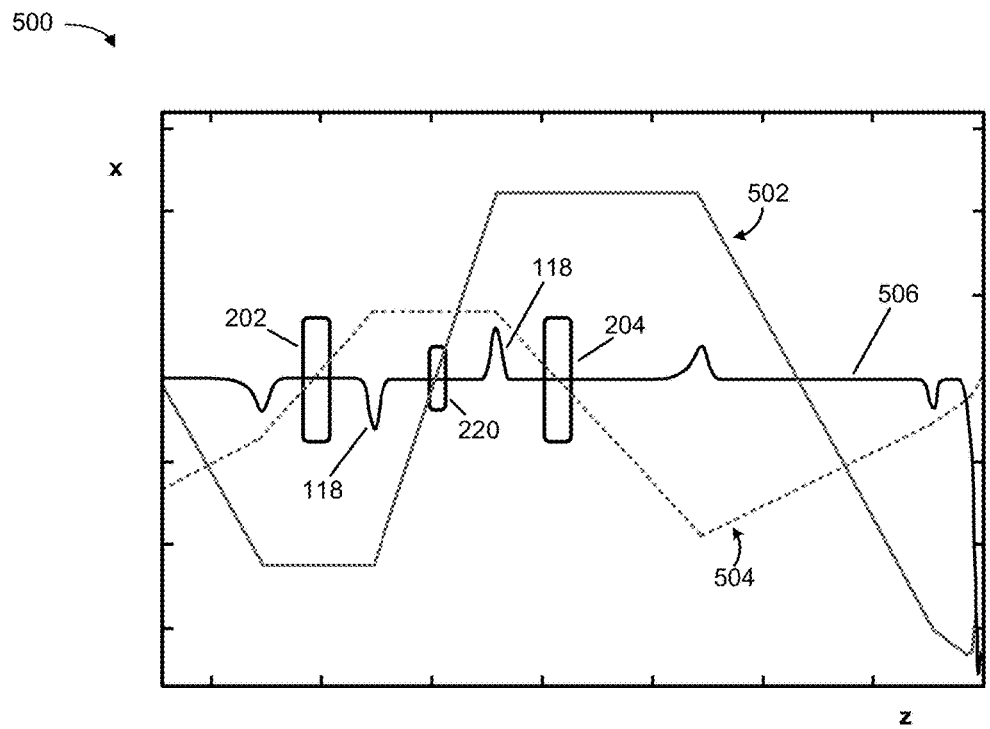
FIG. 5 is a diagram that shows the optical performance of a conventional corrector system.

FIG. 5 is an illustration of the optical performance of a conventional corrector system. FIG. 5 illustrates the optical performance of a conventional corrector system, where a pair of primary multipoles are imaged onto each other. FIG. 5 shows both a beam path of an axial ray 502 of a charged particle beam, and a beam path of an off-axial ray 504 of the charged particle beam which has cross-overs at the centers of the primary hexapoles where the system is operating at a particular accelerating voltage. In each of FIG. 5-8, the line 506 shows the axial magnetic field of the respective system. When the line 506 is non-zero this shows the presence of a magnetic lens, such as the transfer lenses 118.

Figure 6:
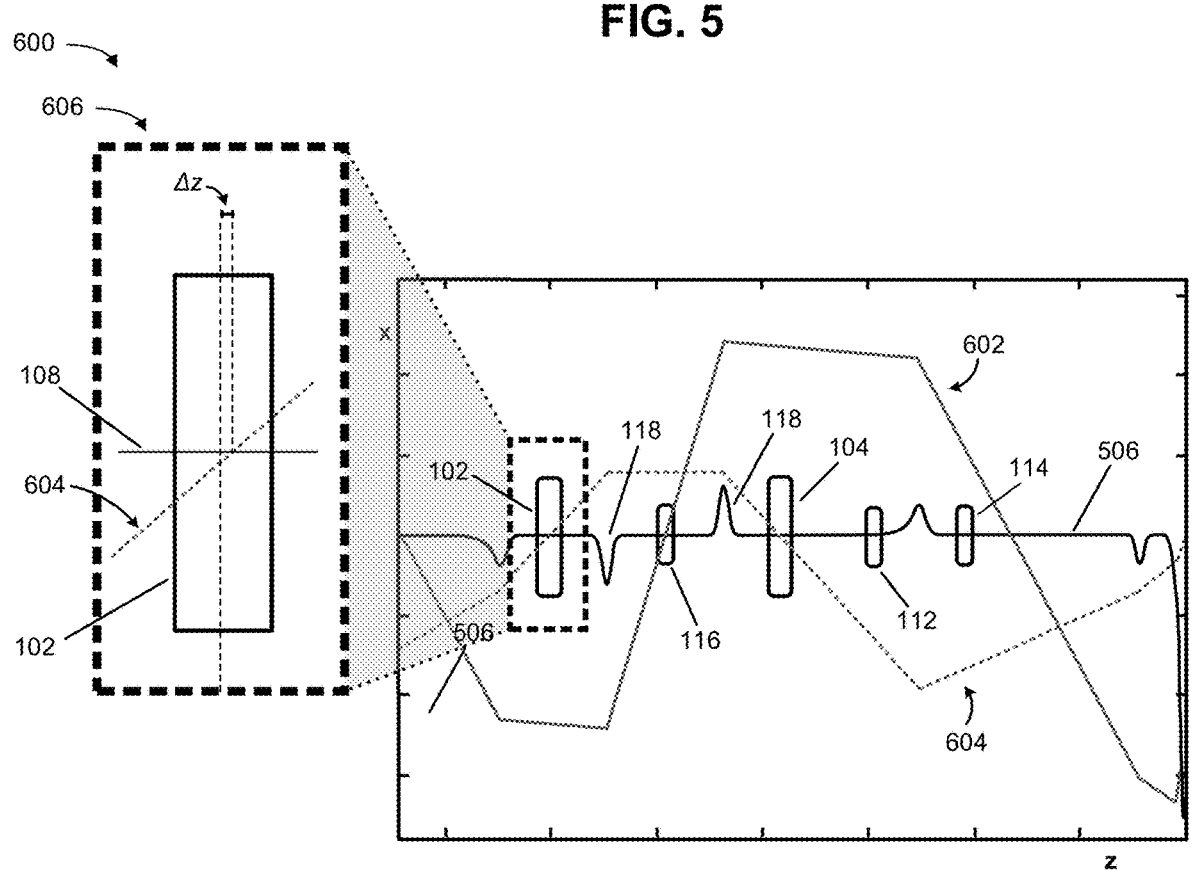
FIG. 6 is a diagram that shows the optical performance of a sixth-order corrected STEM multipole corrector system according to the present disclosure.
Figure 7:
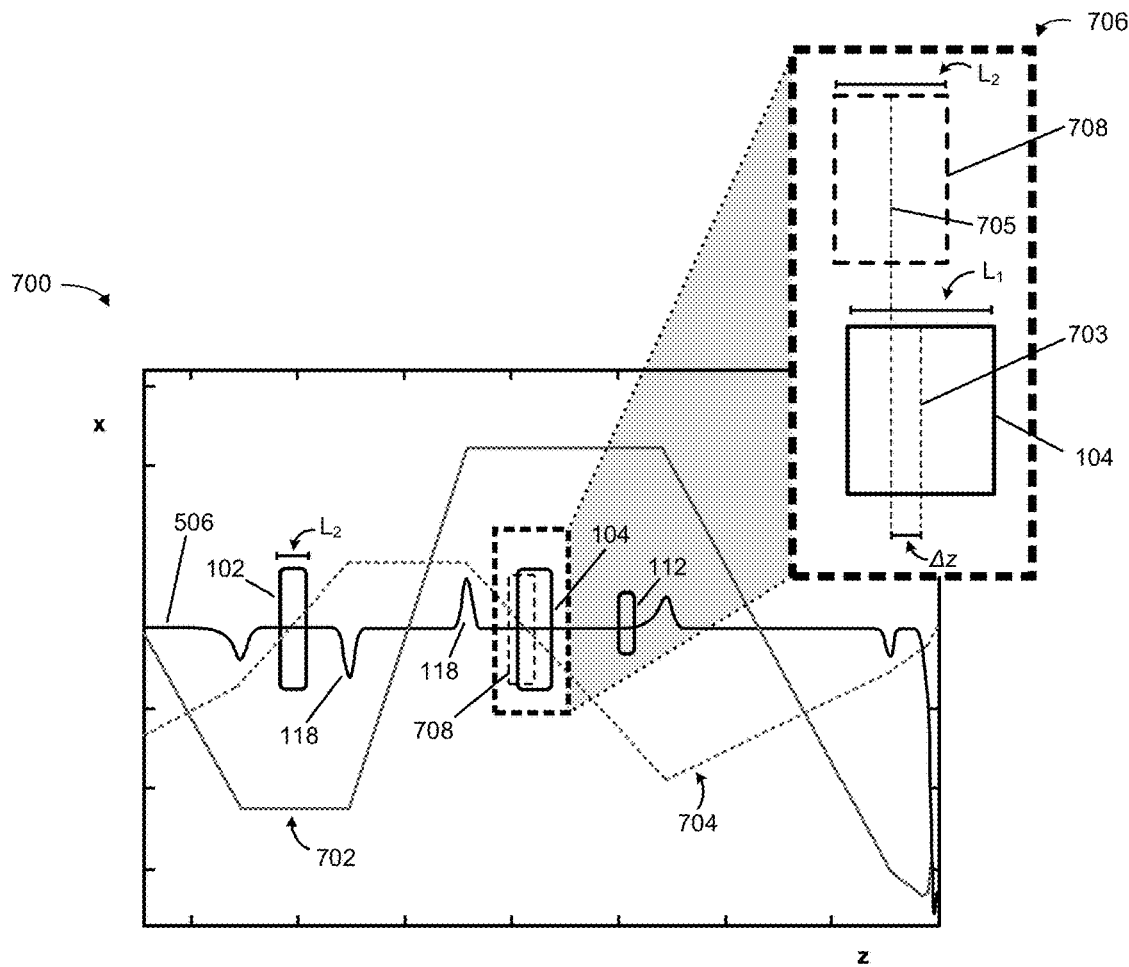
FIG. 7 illustrates the optical performance of a corrected STEM multipole corrector system where the primary multipoles are not imaged onto each other, and where the second primary multipole is displaced asymmetrically.
Figure 8:
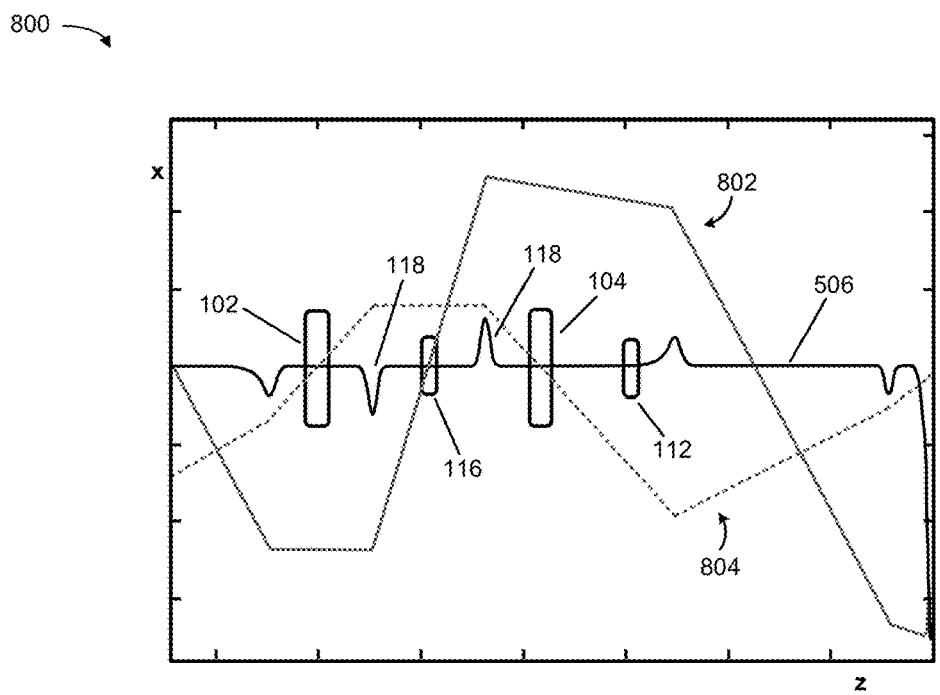
FIG. 8 illustrates the optical performance of an example corrected STEM multipole corrector system having an asymmetric ray path.

FIGS. 6-8 are illustrations of the optical performance of corrected STEM multipole corrector systems according to the present disclosure. FIG. 6 illustrates the optical performance of a corrected STEM multipole corrector system having a tertiary multipole 114 positioned downstream from the secondary multipole 112 for correcting eighth-order aberrations. FIG. 6 shows both a beam path of an axial ray 602 of a charged particle beam, and a beam path of an off-axial ray 604 of charged particle beam where the system is operating at a particular accelerating voltage. As can be seen in the exploded image 606 of the first primary multipole 102, the off-axial ray 604 does not cross through the central axis 108 of the system at the multipole midplane of the first primary multipole 102. Rather the off-axial ray 604 crosses through the central axis 108 at a displacement of Δz from the multipole midplane of the first primary multipole 102. As discussed above, Δz may be created based on a displacement of the primary multipoles compared to a conventional corrector, by a change of excitations of the transfer lenses 118, or a combination thereof. In addition, lenses upstream of the corrector can be adjusted, in order to generate a non-parallel entrance beam. In other embodiments, the off-axial ray 604 passes through the central axis 108 at the multipole midplane of the second primary multipole 102 but does not pass through the central axis 108 at the multipole midplane of the second primary multipole 104.

FIG. 7 illustrates the optical performance of a corrected STEM multipole corrector system where the primary multipoles are not imaged onto each other, and where the second primary multipole is displaced asymmetrically. FIG. 7 shows both a beam path of an axial ray 702 of a charged particle beam, and a beam path of an off-axial ray 704 of charged particle beam where the system is operating at a particular accelerating voltage.

As can be seen in the exploded image 706, the second primary multipole 104 in the depicted embodiment has a different length $L_1$ than the length $L_2$ of conventional multipoles 708 in conventional corrector systems. Additionally, in FIG. 7 the length $L_2$ of the first primary multipole 102 is different from the length $L_1$ of the second primary multipole 104. FIG. 7 depicts the multipole midplane 703 of the second primary multipole 104 being shifted Δz from the position of the multipole midplane 705 of conventional multipoles 708 in conventional corrector systems. This shift Δz depicted in FIG. 7 is asymmetrical. That is, FIG. 7 shows an embodiment where only one of the primary multipoles is displaced such that the symmetry of the corrector in the midplane is abandoned. The values for the shift Δz, the length $L_1$ of the second multipole 104, the position of the secondary multipole 112, the excitation applied to the secondary multipole 112, or a combination thereof may be adjusted such that higher-order aberrations are corrected for. For example, where the multipoles are hexapoles, a combination of the values may be set such that the $A_2=D_4=D_6=0$ (or different optimal value(s)) for appropriate primary hexapole excitation levels.

In some embodiments, the length of the first primary multipole 102 is smaller than the length $L_1$ of the secondary multipole 104. In such embodiments, the values for the length difference between the first primary multipole 102 and the second primary multipole 104, the shift Δz, the length $L_1$ of the second primary multipole 104, the position of the secondary multipole 112, the excitation applied to the secondary multipole 112, or a combination thereof may be adjusted such that even higher-order aberrations are corrected for. For example, where the multipoles are hexapoles, a combination of the values may be set such that the $A_2=D_4=D_6=D_8=0$ (or different optimal value(s)) for appropriate primary hexapole excitation levels. That is, the difference in length between the first primary multipole 102 and the second primary multipole 104 enables correctors according to the present disclosure to correct for the eighth-order aberration $D_8$ without the need for a tertiary multipole 114.

FIG. 8 illustrates the optical performance of a corrected STEM multipole corrector system having an asymmetric ray path. FIG. 8 shows both a beam path of an axial ray 802 of a charged particle beam, and a beam path of an off-axial ray 804 of charged particle beam where the system is operating at a particular accelerating voltage. As can be seen in FIG. 8, one or more of the excitation of the lenses 118, the shift Δz of the second primary multipole 104, the length of the second primary multipole 104, the excitation applied to the second primary multipole 104, or a combination thereof are such that the path of the axial ray 802 is asymmetrical as it travels through the corrector. These values and others discussed above can be adjusted such that the $A_2=D_4=D_6=0$ (or different optimal value(s)) for appropriate primary hexapole excitation levels.

FIG. 9 is an illustration of example multipole corrector systems 900 for correcting the sixth-order aberration including at least a pair of primary multipoles, and a plurality of multipoles positioned downstream of the pair of primary multipoles that are positioned and/or otherwise configured to generate aberrations that combine to correct for sixth-order aberrations or above.

Specifically, FIG. 9 illustrates a corrector according to the present disclosure that includes a pair of primary multipoles 102 and 104, a secondary multipole 112, and a tertiary multipole 114. As discussed above, the inclusion of the tertiary multipole 114 allows the multipole corrector system 900 to correct for three-lobe aberrations up to the sixth-order when the pair of primary multipoles 102 and 104 are imaged onto each other. Alternatively, when the first primary multipole 102 and the second primary multipole 104 are not imaged onto each other, the tertiary multipole 114 allows for the multipole corrector system 900 to correct for three-lobe aberrations up to the eighth-order.

As discussed above, a multipole may correspond to any of dipoles, quadrupoles, hexapoles, octupoles, etc. For example, where the multipoles 104, 112, and/or 114 correspond to hexapole fields, the methods described herein can be used to design and/or configure a multipole corrector system 900 that nullifies 3-fold aberrations (intrinsic and/or parasitic) of any orientation, up to the sixth-order (and in some embodiments up to the sixth-order). As another example, where the multipoles correspond to octupole fields, the methods described herein can be used to design and/or configure a multipole corrector system 900 that nullifies 4-fold aberrations (intrinsic and/or parasitic) of any orientation, up to the seventh-order.

In some embodiments, the example multipole corrector systems 900 may include additional primary multipoles beyond the pair of primary multipoles 102 and 104. For example, in some embodiments an example multipole corrector system 900 may comprise four or six primary multipoles (e.g., a quadrupole octupole corrector). In such embodiments the second multipole 104 corresponds to the primary multipole most proximate to secondary multipole 112.

FIG. 9 shows a charged particle beam 902 that is directed onto a sample 904 by an objective lens 906. FIG. 9 also shows a transfer lens 910 and an optional transfer lens 908 that allows for microscope systems to operate with the objective lens 906 switched off (and the first upstream lens as probe forming lens), for example, for studying specimens in a magnetic-field-free environment, such as in Lorentz microscopy.

Figure 10:
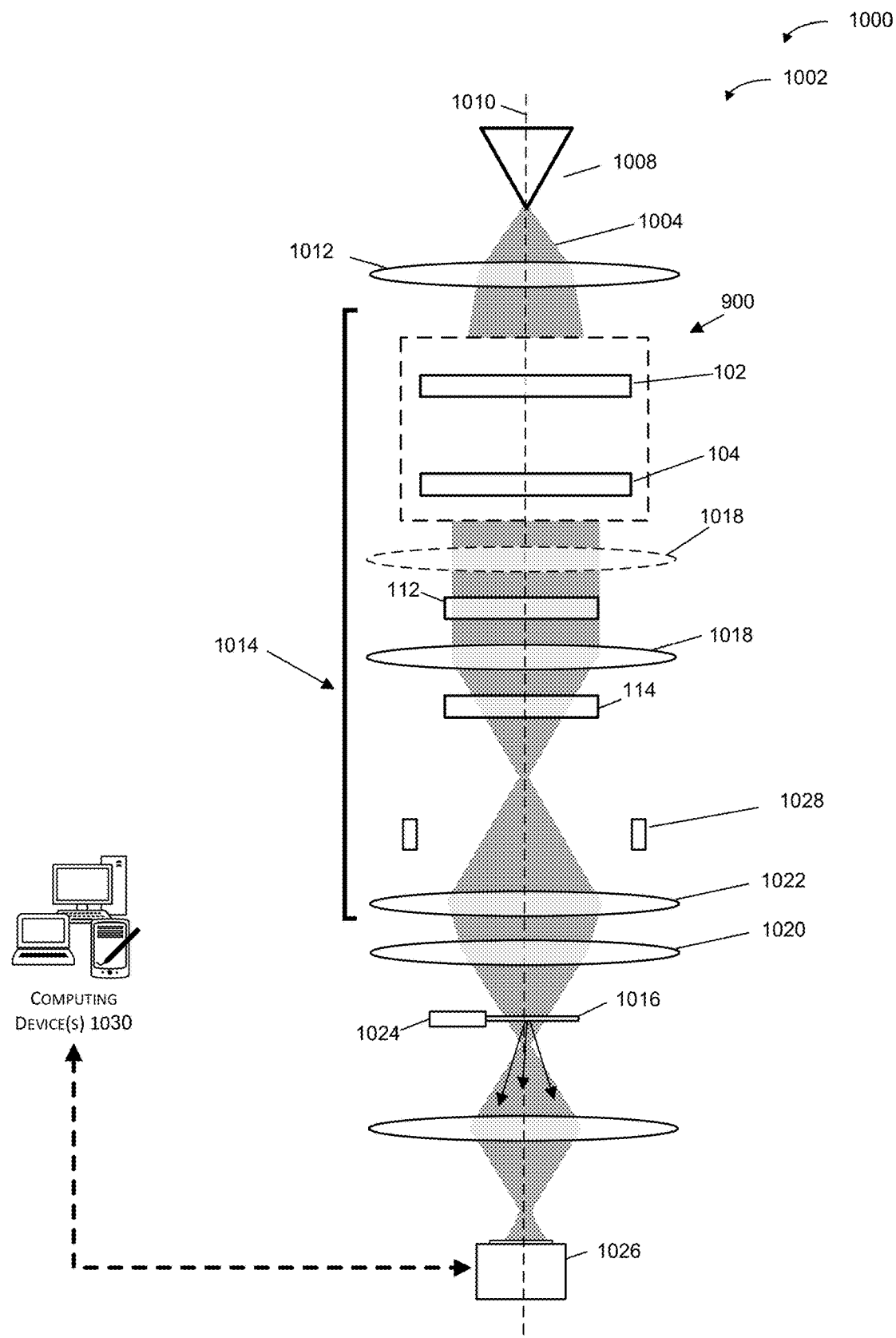
FIG. 10 illustrates example charged particle microscope system including an example multipole corrector system for correcting the sixth-order aberration that comprises at least a pair of primary multipoles that are imaged onto each other.

FIG. 10 shows an example charged particle microscope system(s) 1000 including an example multipole corrector system 900 for correcting the sixth-order aberration. The example charged particle microscope system(s) 1000 illustrated in FIG. 10 is a SEM system 1002 that is capable of operating in a standard mode of operation and a Lorentz mode of operation. That is, the path of the charged particle beam 1004 changes depending on the mode of operation of the example charged particle microscope system(s) 1000.

The example charged particle microscope system(s) 1000 includes a charged particle source 1008 that emits the charged particle beam 1004 along an emission axis 1010 and towards an accelerator lens 1012 that accelerates/decelerates, focuses, and/or directs the charged particle beam 1004 towards a focusing column 1014 that focuses the charged particle beam 1004 so that it is incident on sample 1016. The focusing column 1014 is illustrated as including the example multipole corrector system 900 and an arrangement of a plurality of lenses 1018. In some embodiments, when the example charged particle microscope system 1000 is operating in a Lorentz mode the objective lens 1020 is turned off. In such embodiments, the Lorentz lens 1022 acts like an objective lens and focuses the charged particle beam 1004 onto the sample 1016.

FIG. 10 further illustrates the example charged particle microscope system(s) 1000 as including a sample holder 1024 that holds the sample 1016. The example charged particle microscope system(s) 1000 is also shown as including a detector 1026 that is configured to detect charged particles that are emitted by and/or reflected by the sample 1016 as a result of the charged particle beam 1004 being incident on the sample 1016. In addition, the example charged particle microscope system(s) 1000 is illustrated as including astigmatism correction and scan coils 1028 for causing the charged particle beam 1004 to scan the surface of the sample 1016. FIG. 10 further shows example charged particle microscope system(s) 1000 as optionally including a computing device(s) 1030.

Figure 11:
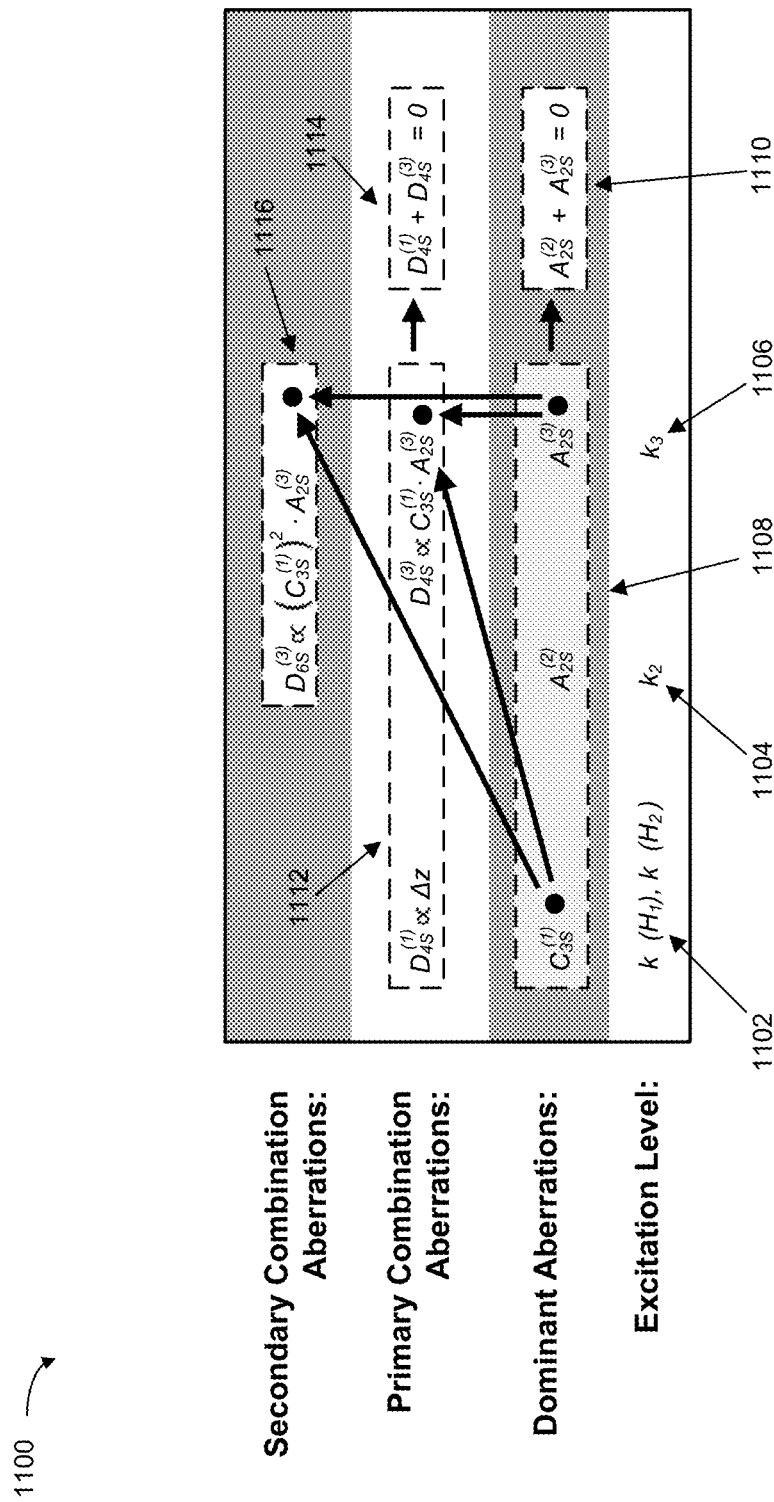
FIG. 11 is a diagram that shows how the aberrations of the first primary multipole, the second primary multipole, and the secondary multipole of the sixth-order corrected STEM multipole corrector system combine to correct for sixth-order aberrations.

FIG. 11 is a diagram 1100 that shows how the dominant aberrations of the first primary multipole, the second primary multipole, and the secondary multipole of the sixth-order corrected STEM multipole corrector system combine at various stages to correct for various orders of aberrations. The diagram 1100 illustrates a first excitation level 1102 applied to each of the first primary multipole 102 and a second primary multipole 104, a second excitation level 1104 that is additively applied to the second primary multipole 104, and a third excitation level 1106 that is applied to the secondary multipole 112. The diagram 1100 also shows the dominant aberrations 1108 generated by the application of such excitation levels, and the relationship 1110 for how these aberrations can be used to correct the second-order threefold astigmatism.

The different multipoles in diagram 1110 are located at different positions in the beam path. These different positions cause combination aberrations through the following effect:

A first multipole $M_1$ changes the direction of a ray by an amount which, in lowest-order, is proportional to its dominant aberration $m_1$.

While the ray propagates to a second multipole $M_2$, this change of direction results in an additional shift dx of the ray at the second multipole (i.e., additional to the shift that could already be present because of a converging or diverging path of the beam). This additional shift dx is proportional to $m_1$ and proportional to the distance d between these two multipoles (dx~$m_1$d).

This dx also causes the second multipole to cause an additional deflection dx' of the ray (i.e., additional to the action that the second multipole would do in the absence of first multipole). This additional dx' is proportional to both dx and the dominant aberration $m_2$ of the second multipole, (dx'~$m_2$dx~$m_1 m_2$d). This additional dx' is called a combination aberration of multipoles $M_1$ and $M_2$. It can be classified as a primary combination aberration because it is generated by the lowest-order effects of $M_1$ and $M_2$.

In a similar way, the second-lowest-order effect of the first multipole creates a shift $(m_1 d)^2$ at the second multipole, which can be classified as a secondary combination aberration dx'~$m_1^2 m_2 d^2$.

This concept of combination aberrations can not only be applied to a combination of one multipole with another multipole, but also to a combination of one set of optical elements (such as a hexapole corrector consisting of two hexapoles and two transfer lenses—of which the dominant aberration is a negative spherical aberration) with a multipole, or to the combination of one set of optical elements with another set of optical elements. In the present disclosure, the general term combination aberrations is intended to refer to any primary combination aberration, secondary combination aberration, tertiary combination aberration, etc., and/or a combination thereof.

The diagram 1100 also shows the primary combination aberrations 1112 generated by application of the excitation levels, and the relationship 1114 for how the primary combination aberrations can be used to correct the fourth-order threefold aberration. Finally, diagram 1100 also depicts the secondary combination aberration 1116 generated by application of the excitation levels, which when the sixth-order corrected STEM multipole corrector system is optimally configured, corrects for the sixth-order three lobe aberration of the microscope system.

Figure 12:
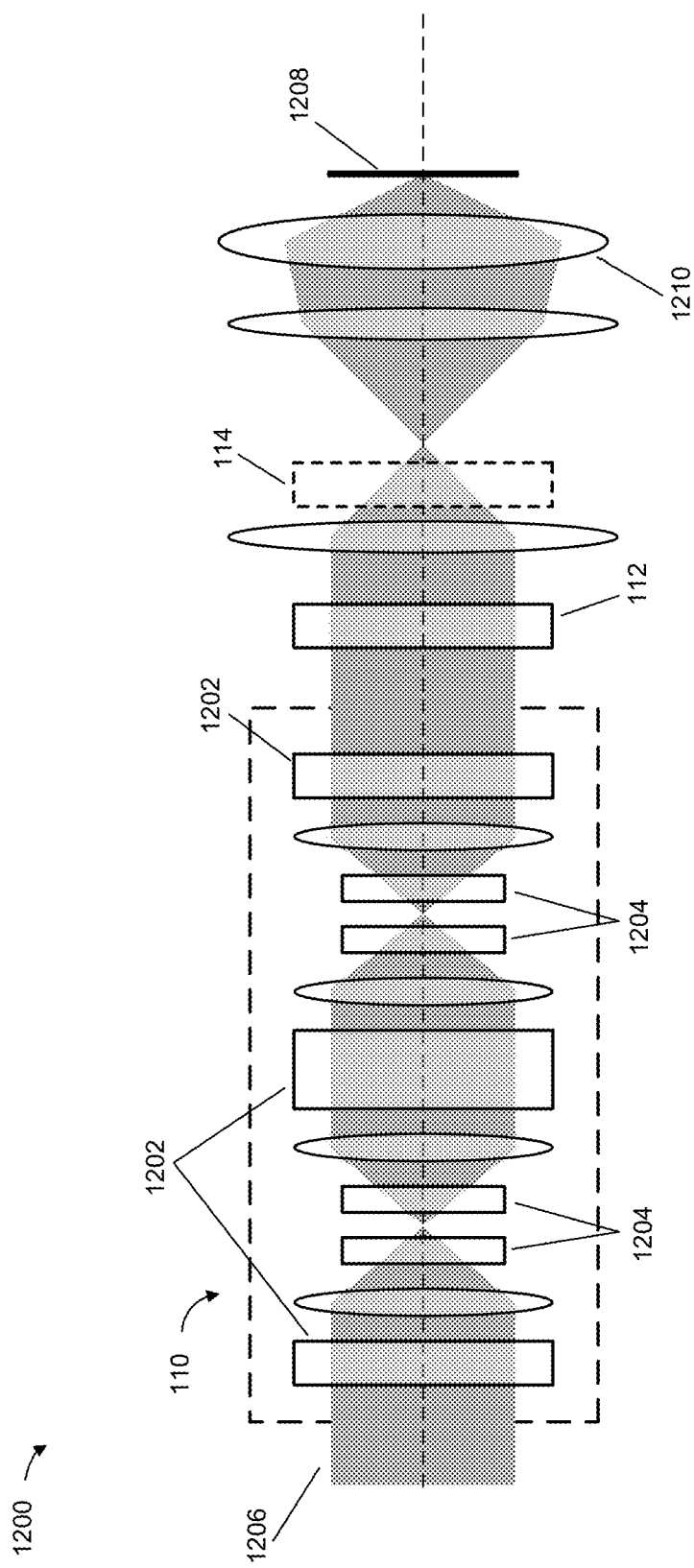
FIG. 12 illustrates example multipole imaging corrector systems for correcting the sixth-order aberration including at least a pair of primary multipoles that are imaged onto each other, and a plurality of multipoles positioned downstream of the pair of primary multipoles that are positioned and/or otherwise configured to generate aberrations that combine to correct for sixth-order aberrations or above.

FIG. 12 is an illustration of example multipole corrector systems 1200 for correcting the sixth-order aberration including at least a pair of primary multipoles, and a plurality of multipoles positioned downstream of the pair of primary multipoles that are positioned and/or otherwise configured to generate aberrations that combine to correct for sixth-order aberrations or above.

Specifically, FIG. 12 illustrates a multipole corrector system 1200 according to the present disclosure that includes a triad of primary multipoles 1202 (two of which correspond to primary multipoles 102 and 104), a secondary multipole 112, and an optional tertiary multipole 114. As discussed above, the inclusion of the tertiary multipole 114 allows the multipole corrector system 1200 to correct for three lobe aberrations up to the sixth-order when the triad of primary multipoles 1202 are imaged onto each other, in the sense that they do not generate $D_4$. Alternatively, when the triad of primary multipoles 1202 are not imaged onto each other, the tertiary multipole 114 allows for the multipole corrector system 1200 to correct for three lobe aberrations up to the eighth-order. Alternatively, the mutual image condition of the primary multipoles 1202 and the excitations of secondary multipoles 112 and 114 can be tuned such that all three lobe aberrations up to order 6 are corrected, and that second order off-axial astigmatism is zero.

FIG. 12 further shows the multipole corrector system as optionally including a plurality of weak hexapoles 1204 (e.g., weak hexapoles). In some embodiments the plurality of weak multipoles may include two anti-symmetric pairs of weak multipoles, in order to correct for off-axial coma. FIG. 12 further shows a charged particle beam 1206 that is directed onto a sample 1208 by an objective lens 1210.

Figure 13:
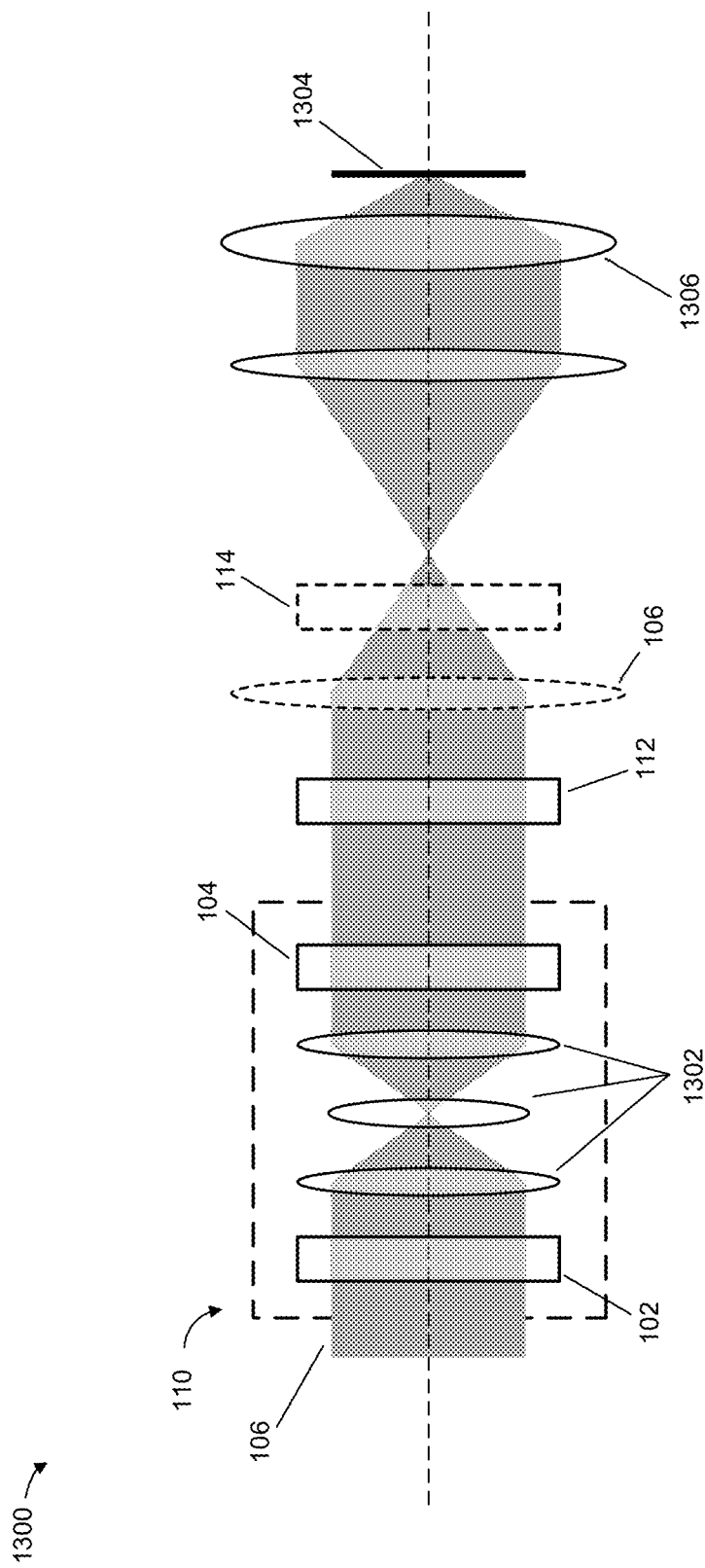
FIG. 13 illustrates example multipole corrector systems for correcting the sixth-order aberration including at least a pair of primary multipoles that are imaged onto each other, and a plurality of multipoles positioned downstream of the pair of primary multipoles that are positioned and/or otherwise configured to generate aberrations that combine to correct for sixth-order aberrations or above.

FIG. 13 is an illustration of example multipole corrector systems 1300 for correcting the sixth-order aberration including a pair of primary multipoles, a plurality of transfer lens including a weak round transfer lens, and a plurality of multipoles positioned downstream of the pair of primary multipoles that are positioned and/or otherwise configured to generate aberrations that combine to correct for sixth-order aberrations or above.

Specifically, FIG. 13 illustrates a multipole corrector system 1300 according to the present disclosure that includes a triad of transfer lenses multipoles 1302 (the central transfer lens corresponding to a weak round transfer lens), a secondary multipole 112, and an optional tertiary multipole 114. As discussed above, the inclusion of the tertiary multipole 114 allows the multipole corrector system 1300 to correct for three lobe aberrations up to the sixth-order when the pair of primary multipoles 102 and 104 are imaged onto each other. Alternatively, when the first primary multipole 102 and the second primary multipole 104 are not imaged onto each other, the tertiary multipole 114 allows for the multipole corrector system 1300 to correct for three lobe aberrations up to the eighth-order. In some embodiments, the length of the first primary multipole 102 may be different than then length of the second primary multipole 104 such that the first primary multipole 102 and the second primary multipole 104 are not imaged onto each other. FIG. 13 further shows a charged particle beam 106 that is directed onto a sample 1304 by an objective lens 1306.

Figure 14:
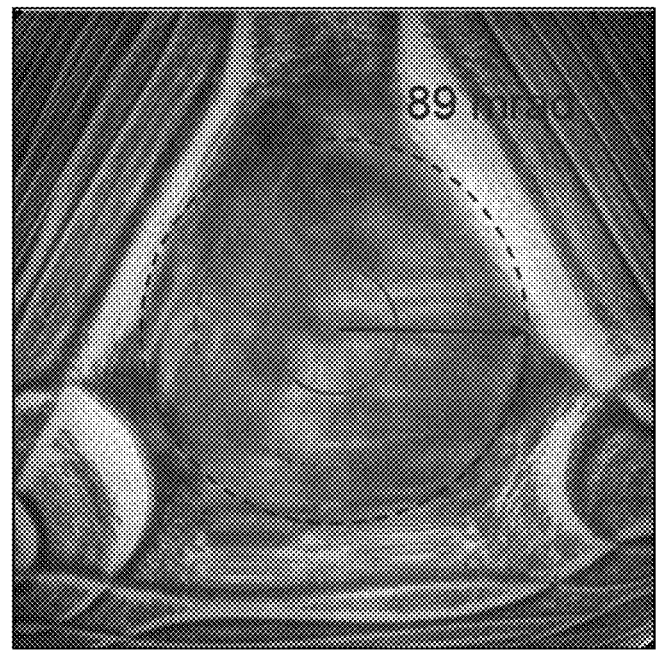
FIG. 14 is a flat Ronchigram image generated by a microscope system with a conventional correcting system, limited by $D_6$.
Figure 15:
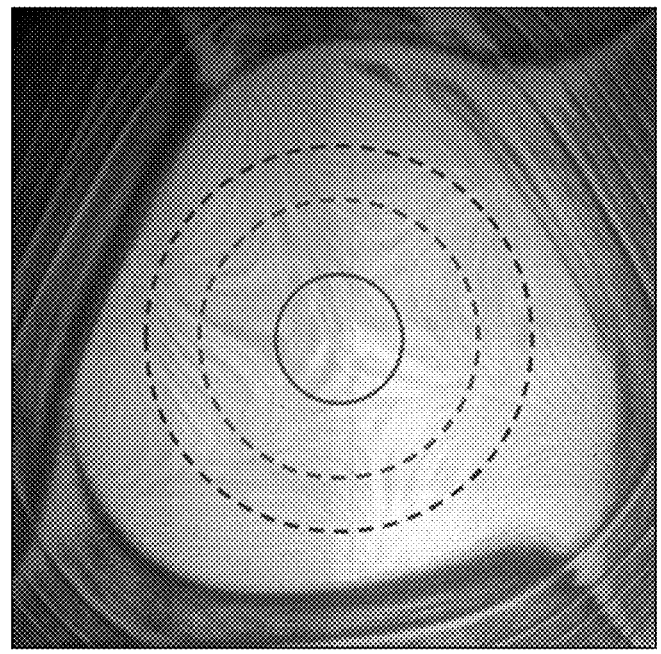
FIG. 15 is a flat Ronchigram image generated by a microscope system with a sixth-order corrected STEM multipole corrector system.
Figure 16:
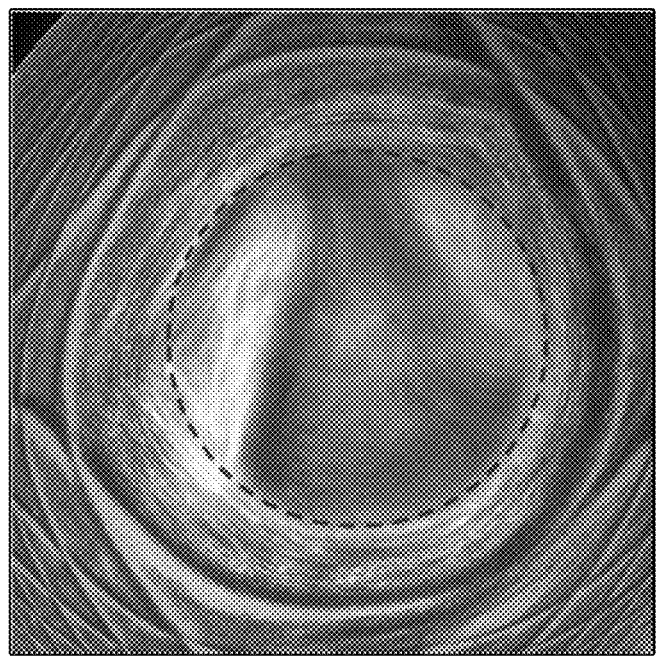
FIG. 16 is a flat Ronchigram image generated by a microscope system with a sixth and eighth-order corrected STEM multipole corrector system where both $D_6$ and $D_8$ are strongly reduced.

FIGS. 14-16 are flat Ronchigram images generated by microscope systems with a conventional correcting system, a sixth-order corrected STEM multipole corrector system, and an eighth-order corrected STEM multipole corrector system, respectively. A Ronchigram is a projection image (pattern) of a specimen formed on the diffraction plane with a convergent incident electron beam focused near the specimen using a probe-forming lens. A flat Ronchigram is used to illustrate corrector performance in a microscope system. A comparison between FIG. 14 and FIGS. 15-16 shows that the sixth-order corrected STEM multipole corrector system and the eighth-order corrected STEM multipole corrector system create a larger aberration free area (i.e., a semi-angle~100 mrad) than conventional corrector systems which are corrected up to order 5 (i.e., less than 80 mrad).

Examples of inventive subject matter according to the present disclosure are described in the following enumerated paragraphs.

A1. A corrector for correcting axial aberrations in a charged particle system, the corrector comprising:

a first primary hexapole for generating a first primary hexapole field when a first excitation is applied to the first primary hexapole;

a second primary hexapole for generating a second primary hexapole field when a second excitation is applied to the second primary hexapole, wherein the second primary hexapole is positioned between the first primary hexapole and a lens which is a source of spherical aberration when the corrector is used within a charged particle system, and wherein the first primary hexapole is not imaged onto the second primary hexapole such that a combination fourth-order aberration is created; and a secondary hexapole for correcting the fourth-order aberration and the sixth-order aberration, wherein the secondary hexapole is positioned between the second primary hexapole and the lens when the corrector is used within the charged particle system.

A1.0.1. The corrector of paragraph A1, wherein the lens which is the source of spherical aberration is a particle-optical lens.

A1.0.2. The corrector of any of paragraphs A1-A1.0.1, wherein the lens acts as an objective lens when the corrector is used within the charged particle system.

A1.0.3. The corrector of any of paragraphs A1-A1.0.2, wherein the lens is the main source of spherical aberration when the corrector is used within the charged particle microscope system.

A1.0.4. The corrector of any of paragraphs A1-A1.0.3, wherein the charged particle system is a charged particle microscope system.

A1.0.5. The corrector of any of paragraphs A1-A1.0.4, wherein the charged particle system is an electron microscope system.

A1.1. The corrector of any of paragraphs A1-A1.0.5, wherein the secondary hexapole is configured such that it generates a third hexapole field when a third excitation is applied to the secondary hexapole.

A1.1.1. The corrector of paragraph A1.1, wherein the third hexapole field creates one or more aberrations that correct the fourth-order aberration and the sixth-order aberration.

A1.2. The corrector of any of paragraphs A1-A1.1.1, further comprising a tertiary hexapole for correcting an eighth-order aberration, wherein the tertiary hexapole is positioned between the secondary hexapole and the lens when the corrector is used within the charged particle system.

A1.2.1. The corrector of paragraphs A1.2, wherein the tertiary hexapole is configured such that it generates a fourth hexapole field when a fourth excitation is applied to the tertiary hexapole.

A1.2.1.1. The corrector of paragraph A1.2.1, wherein the fourth hexapole field creates one or more aberrations that correct the eight-order aberration.

A1.2.1.1.1. The corrector of paragraph A1.2.1.1, wherein the fourth hexapole field creates one or more combination aberrations (e.g., primary combination aberrations, secondary combination aberrations, etc.) that correct the eighth-order aberration.

A2. The corrector of any of paragraphs A1-A1.2.1.1, wherein the secondary hexapole creates a second-order aberration that creates a first combination aberration that corrects the fourth-order aberration.

A2.1. The corrector of paragraphs A2, wherein the first combination aberration includes or corresponds to a primary combination aberration.

A2.2. The corrector of paragraphs A2, wherein the first combination aberration includes or corresponds to a secondary combination aberration.

A3. The corrector of any of paragraphs A1-A2.2, wherein the secondary hexapole is configured such that, when positioned in an optical column of a charged particle microscope, a position aberration created by a drift space between the corrector and an objective lens combines with an additional aberration generated by the secondary hexapole to form a second combination aberration that corrects the sixth-order aberration.

A3.1. The corrector of paragraphs A3, wherein the second combination aberration includes or corresponds to a primary combination aberration.

A3.2. The corrector of paragraphs A3, wherein the second combination aberration includes or corresponds to a secondary combination aberration.

A4. The corrector of any of paragraphs A1-A3.2, wherein the contribution of the first primary hexapole, the contribution of the second primary hexapole, and the contribution of any transfer optics between the first primary hexapole and the second primary hexapole do not cancel.

A4.1. The corrector of paragraph A4, wherein first excitation corresponds to an excitation voltage that, when applied to the first primary hexapole causes the first primary hexapole to generate the first primary hexapole field.

A4.2. The corrector of paragraph A4, wherein first excitation corresponds to an excitation current that, when applied to the first primary hexapole causes the first primary hexapole to generate the first primary hexapole field.

A4.3. The corrector of any of paragraphs A4-A4.2, wherein the second excitation is greater than the first excitation.

A4.4. The corrector of any of paragraphs A4-A4.3, wherein the contribution of the first primary hexapole, the contribution of the second primary hexapole, and the contribution of any transfer optics between the first primary hexapole and the second primary hexapole produce a 3-fold astigmatism $A_2$ and a fourth-order 3-lobe aberration $D_4$.

A5. The corrector of any of paragraphs A1-A4.4, wherein the first primary hexapole not being imaged onto the second primary hexapole corresponds to a first displacement of the first primary hexapole along the axis from a position where the first primary hexapole is imaged onto the second primary hexapole.

A5.1. The corrector of paragraphs A5, wherein the first displacement is 0.1 mm, 0.5 mm, 1 mm or greater.

A5.2. The corrector of paragraphs A5, wherein the first displacement is 0.1%, 0.5%, or 1% of the distance between the two primary hexapoles or greater.

A6. The corrector of any of paragraphs A1-A5.2, wherein the first primary hexapole not being imaged onto the second primary hexapole corresponds to a second displacement of the second primary hexapole along the axis from a position where the first primary hexapole is imaged onto the second primary hexapole.

A6.1. The corrector of paragraphs A6, wherein the second displacement is 0.1 mm, 0.5 mm, 1 mm or greater.

A6.2. The corrector of paragraphs A6, wherein the second displacement is 0.1%, 0.5%, or 1% of the distance between the two primary hexapoles or greater.

A7. The corrector of any of paragraphs A6-A6.2, when dependent from A5-A5.1, wherein the first displacement is of the same magnitude as the second displacement.

A8. The corrector of any of paragraphs A6-A7, when dependent from A5-A5.1, wherein the first displacement is in an opposite direction as the second displacement.

A9. The corrector of any of paragraphs A1-A4, wherein the first primary hexapole not being imaged onto the hexapole corresponds to the beam entering the first primary hexapole at a non-parallel angle.

A9.1. The corrector of paragraphs A9, wherein the first primary hexapole not being imaged onto the hexapole corresponds to one or more lens excitations of lenses upstream of the corrector are such that the beam enters the first primary hexapole at the non-parallel angle.

A9.2. The corrector of paragraphs A9, the beam entering the first primary hexapole at a non-parallel angle corresponds to the beam entering the first primary hexapole at a divergent angle.

A10. The corrector of any of paragraphs A1-A9.2, further comprising a set of one or more transfer lenses between the first primary hexapole and the second primary hexapole.

A11. The corrector of any of paragraphs A1-A9.1, further comprising a third hexapole positioned between the first primary hexapole and the second primary hexapole.

A11.1. The corrector of paragraphs A1, further comprising a first set of one or more transfer lenses between the first primary hexapole and the third hexapole, and a second set of one or more transfer lenses between the third hexapole and the second primary hexapole.

A11.2. The corrector of any of paragraphs A11-A11.1, wherein the third hexapole positioned between the first primary hexapole and the second primary hexapole is a third primary hexapole.

A11.3. The corrector of any of paragraphs A11-A11.2, wherein the third hexapole positioned between the first primary hexapole and the second primary hexapole is a weak mid-hexapole.

A12. The corrector of any of paragraphs A1-A12.4, further comprising a third hexapole positioned upstream of the first primary hexapole.

A12.1. The corrector of paragraphs A2, further comprising a first set of one or more transfer lenses between the third hexapole and the first primary hexapole, and a second set of one or more transfer lenses between the first primary hexapole and the second primary hexapole.

A13. The corrector of any of paragraphs A1-A9.1, further comprising a third hexapole positioned between the second primary hexapole and the secondary hexapole.

A13.1. The corrector of paragraphs A13, further comprising a first set of one or more transfer lenses between the first primary hexapole and the second primary hexapole, and a second set of one or more transfer lenses between the second primary hexapole and the third hexapole.

A14. The corrector of any of paragraphs A1-A13.1, wherein a first length of the first primary hexapole is different from a second length of the second primary hexapole.

A14.1. The corrector of paragraph A14, wherein the second length is greater than the first length.

A15. The corrector of any of paragraphs B1-B14.1, further comprising one or more additional primary hexapoles.

A15.1. The corrector of paragraph B15, wherein when an additional excitation is applied to at least one of the one or more additional primary hexapoles an additional hexapole field is created that contributes to the combination fourth-order aberration.

B1. A corrector for correcting axial aberrations in a charged particle system, the corrector comprising:

a first primary multipole for generating a first primary multipole field when a first excitation is applied to the first primary multipole;

a second primary multipole for generating a second primary multipole field when a second excitation is applied to the second primary multipole, wherein the second primary multipole is positioned between the first primary multipole and a lens which is a source of spherical aberration when the corrector is used within the charged particle system, wherein the first primary multipole is not imaged onto the second primary multipole such that a combination fourth-order aberration is created; and a secondary multipole for correcting the fourth-order aberration and a sixth-order aberration, wherein the secondary multipole is positioned between the second primary multipole and the lens when the corrector is used within the charged particle system.

B1.0.1. The corrector of paragraph B1, wherein the lens which is the main source of spherical aberration is the particle-optical lens.

B1.0.2. The corrector of any of paragraphs B1-B1.0.1, wherein the lens acts as an objective lens when the corrector is used within the charged particle system.

B1.0.3. The corrector of any of paragraphs B1-B1.0.2, wherein the lens is the main source of spherical aberration when the corrector is used within the charged particle system.

B1.0.4. The corrector of any of paragraphs B1-B1.0.3, wherein the charged particle system is a charged particle microscope system.

B1.0.5. The corrector of any of paragraphs B1-B1.0.4, wherein the charged particle system is an electron microscope system.

B1.1. The corrector of any of paragraphs B1-B1.0.1, wherein the secondary multipole is configured such that it generates a third multipole field when a third excitation is applied to the secondary multipole.

B1.1.1. The corrector of paragraph B1.1, wherein the third multipole field creates one or more aberrations that correct the fourth-order aberration and the sixth-order aberration.

B1.2. The corrector of paragraphs B1, further comprising a tertiary multipole for correcting an eighth-order aberration, wherein the tertiary multipole is positioned between the secondary multipole and the lens when the corrector is used within the charged particle system.

B1.2.1. The corrector of paragraphs B1.2, wherein the tertiary multipole is configured such that it generates a fourth multipole field when a fourth excitation is applied to the tertiary multipole.

B1.2.1.1. The corrector of paragraph B1.2.1, wherein the fourth multipole field creates one or more aberrations that correct the eight-order aberration.

B1.2.1.1.1. The corrector of paragraph B1.2.1.1, wherein the fourth hexapole field creates one or more combination aberrations (e.g., primary combination aberrations, secondary combination aberrations, etc.) that correct the eight-order aberration.

B2. The corrector of any of paragraphs B1-B1.1.1, wherein the secondary multipole creates a second-order aberration that creates a first combination aberration that corrects the fourth-order aberration.

B2.1. The corrector of paragraphs B2, wherein the first combination aberration includes or corresponds to a primary combination aberration.

B2.2. The corrector of paragraphs B2, wherein the first combination aberration includes or corresponds to a secondary combination aberration.

B3. The corrector of any of paragraphs B1-B2.2, wherein the secondary multipole is configured such that, when positioned in an optical column of a charged particle microscope, a position aberration created by a drift space between the corrector and an objective lens combines with an additional aberration generated by the secondary multipole to form a second combination aberration that corrects the sixth-order aberration.

B3.1. The corrector of paragraphs B3, wherein the first combination aberration includes or corresponds to a primary combination aberration.

B3.2. The corrector of paragraphs B3, wherein the first combination aberration includes or corresponds to a secondary combination aberration.

B4. The corrector of any of paragraphs B1-B3.2, wherein the contribution of the first primary multipole, the contribution of the second primary multipole, and the contribution of any transfer optics between the first primary multipole and the second primary multipole do not cancel.

B4.1. The corrector of paragraph B4, wherein first excitation corresponds to an excitation voltage that, when applied to the first primary multipole causes the first primary multipole to generate the first primary multipole field.

B4.2. The corrector of paragraph B4, wherein first excitation corresponds to an excitation current that, when applied to the first primary multipole causes the first primary multipole to generate the first primary multipole field.

B4.3. The corrector of any of paragraphs B4-B4.2, wherein the second excitation is greater than the first excitation.

B4.4. The corrector of any of paragraphs B4-B4.3, wherein the contribution of the first primary multipole, the contribution of the second primary multipole, and the contribution of any transfer optics between the first primary multipole and the second primary multipole produce a 3-fold astigmatism A2 and a fourth-order 3-lobe aberration $D_4$.

B5. The corrector of any of paragraphs B1-B4.4, wherein the first primary multipole not being imaged onto the second primary multipole corresponds to a first displacement of the first primary multipole along the axis from a position where the first primary multipole is imaged onto the second primary multipole.

B5.1. The corrector of paragraphs B5, wherein the first displacement is 0.1 mm, 0.5 mm, 1 mm or greater.

B5.2. The corrector of paragraphs B5, wherein the first displacement is 0.1%, 0.5%, or 1% of the distance between the two primary multipoles or greater.

B6. The corrector of any of paragraphs B1-B5.2, wherein the first primary multipole not being imaged onto the second primary multipole corresponds to a second displacement of the second primary multipole along the axis from a position where the first primary multipole is imaged onto the second primary multipole.

B6.1. The corrector of paragraphs B6, wherein the second displacement is 0.1 mm, 0.5 mm, 1 mm or greater.

B6.2. The corrector of paragraphs B6, wherein the first displacement is 0.1%, 0.5%, or 1% of the distance between the two primary multipoles or greater.

B7. The corrector of any of paragraphs B6-B6.2, when dependent from B5-B5.1, wherein the first displacement is of the same magnitude as the second displacement.

B8. The corrector of any of paragraphs B6-B7, when dependent from B5-B5.1, wherein the first displacement is in an opposite direction as the second displacement.

B9. The corrector of any of paragraphs B1-B4, wherein the first primary multipole not being imaged onto the multipole corresponds to the beam entering the first primary multipole at one of a divergent or convergent angle.

B9.1. The corrector of paragraphs B9, wherein the first primary multipole not being imaged onto the multipole corresponds to one or more lens excitations of lenses upstream of the corrector are such that the beam enters the first primary multipole at one of a divergent or convergent angle.

B9.2. The corrector of paragraphs B9, the beam entering the first primary multipole at a non-parallel angle corresponds to the beam entering the first primary multipole at a divergent angle.

B10. The corrector of any of paragraphs B1-B9.1, further comprising a set of one or more transfer lenses between the first primary multipole and the second primary multipole.

B11. The corrector of any of paragraphs B1-B9.1, further comprising a third multipole positioned between the first primary multipole and the second primary multipole.

B11.1. The corrector of paragraphs B 1, further comprising a first set of one or more transfer lenses between the first primary multipole and the third multipole, and a second set of one or more transfer lenses between the third multipole and the second primary multipole.

B11.2. The corrector of any of paragraphs B11-B11.1, wherein the third multipole positioned between the first primary multipole and the second primary multipole is a third primary multipole.

B11.3. The corrector of any of paragraphs B11-B11.2, wherein the third multipole positioned between the first primary multipole and the second primary multipole is a weak mid-multipole.

B12. The corrector of any of paragraphs B1-B11.3, further comprising a third multipole positioned upstream of the first primary multipole.

B12.1. The corrector of paragraphs B2, further comprising a first set of one or more transfer lenses between the third multipole and the first primary multipole, and a second set of one or more transfer lenses between the first primary multipole and the second primary multipole.

B13. The corrector of any of paragraphs B1-B9.1, further comprising a third multipole positioned between the second primary multipole and the secondary multipole.

B13.1. The corrector of paragraphs B13, further comprising a first set of one or more transfer lenses between the first primary multipole and the second primary multipole, and a second set of one or more transfer lenses between the second primary multipole and the third multipole.

B14. The corrector of paragraphs B1-B13.1, wherein the multipoles are hexapoles.

B14. The corrector of any of paragraphs B1-B13.1, wherein a first length of the first primary multipole is different from a second length of the second primary multipole.

B14.1. The corrector of paragraph B14, wherein the second length is greater than the first length.

B15. The corrector of any of paragraphs B1-B14.1, further comprising one or more additional primary multipoles.

B15.1. The corrector of paragraph B15, wherein when an additional excitation is applied to at least one of the one or more additional primary multipoles an additional multipole field is created that contributes to the combination fourth-order aberration.

C1. A corrector for correcting axial aberrations in a charged particle system, the corrector comprising:
a first primary multipole for generating a first primary multipole field when a first excitation is applied to the first primary multipole;
a second primary multipole for generating a second primary multipole field when a second excitation is applied to the second primary multipole, wherein the second primary multipole is positioned between the first primary multipole and a lens which is a source of spherical aberration when the corrector is used within the charged particle system, and wherein the first primary multipole is imaged onto the second primary multipole;
a secondary multipole for generating a third multipole field when a third excitation is applied to the secondary multipole, wherein the secondary multipole is positioned between the second primary multipole and the lens when the corrector is used within the charged particle system; and
a tertiary multipole for generating a fourth multipole field when a fourth excitation is applied to the tertiary multipole, wherein the tertiary multipole is positioned between the secondary multipole and the lens when the corrector is used within the charged particle system, wherein the third multipole field and the fourth multipole field correct the sixth-order aberration.

C1.0.1. The corrector of paragraph C1, wherein the lens which is the main source of spherical aberration is the particle-optical lens.

The corrector of any of paragraphs C1-C1.0.1, wherein the lens acts as an objective lens when the corrector is used within the charged particle system.

C1.0.3. The corrector of any of paragraphs C1-C1.0.2, wherein the lens is the main source of spherical aberration when the corrector is used within the charged particle system.

C1.0.4. The corrector of any of paragraphs C1-C1.0.3, wherein the charged particle system is a charged particle microscope system.

C1.0.5. The corrector of any of paragraphs C1-C1.0.4, wherein the charged particle system is an electron microscope system.

C1.1. The corrector of any of paragraphs C1-C1.0.1, further comprising a quaternary multipole for correcting an eighth-order aberration, wherein the quaternary multipole is positioned between the tertiary multipole and the particle-optical lens when the corrector is used within the charged particle microscope system.

C1.1.1. The corrector of paragraphs C1.1, wherein the quaternary multipole is configured such that it generates a fifth multipole field when a fifth excitation is applied to the quaternary multipole.

C1.1.1.1. The corrector of paragraph C1.1.1, wherein the fifth multipole field creates one or more aberrations that correct the eight-order aberration.

C2. The corrector of any of paragraphs C1-C1.1.1.1, wherein the contribution of the first primary multipole, the contribution of the second primary multipole, and the contribution of any transfer optics between the first primary multipole and the second primary multipole do not cancel.

C2.1. The corrector of paragraph C2, wherein first excitation corresponds to an excitation voltage that, when applied to the first primary multipole causes the first primary multipole to generate the first primary multipole field.

C2.2. The corrector of paragraph C2, wherein first excitation corresponds to an excitation current that, when applied to the first primary multipole causes the first primary multipole to generate the first primary multipole field.

C2.3. The corrector of any of paragraphs C2-C2.2, wherein the second excitation is greater than the first excitation.

C2.4. The corrector of any of paragraphs C2-C2.3, wherein the contribution of the first primary multipole, the contribution of the second primary multipole, and the contribution of any transfer optics between the first primary multipole and the second primary multipole produce a 3-fold astigmatism $A_2$ and a fourth-order 3-lobe aberration $D_4$.

C3. The corrector of any of paragraphs C1-C2.4, further comprising a set of one or more transfer lenses between the first primary multipole and the second primary multipole.

C4. The corrector of any of paragraphs C1-C3, further comprising a third multipole positioned between the first primary multipole and the second primary multipole C5. The corrector of paragraphs C1-C5, wherein the multipoles are hexapoles.

C6. The corrector of any of paragraphs C1-C5, wherein a first length of the first primary multipole is different from a second length of the second primary multipole.

C6.1. The corrector of paragraph C6, wherein the second length is greater than the first length.

D1. A charged particle microscope comprising: a charged particle source configured to emit a charged particle beam toward a sample; an optical column configured to focus the charged particle beam onto the sample, wherein the optical column comprises the corrector of any of paragraphs A1-A13.1, B1-B14, or C1-C5.

E1. Use of the corrector of any of paragraphs A1-A13.1, B1-B14, or C1-C5.

F1. Use of the charged particle microscope of paragraph D1.

What is claimed is:

1. A corrector for correcting axial aberrations in a charged particle microscope system, the corrector comprising:
   a first primary hexapole that generates a first primary hexapole field when a first excitation is applied to the first primary hexapole;
   a second primary hexapole that generates a second primary hexapole field when a second excitation is applied to the second primary hexapole, wherein the second primary hexapole is positioned between the first primary hexapole and a lens which is the main source of spherical aberration when used in the charged particle microscope system, and wherein the first primary hexapole is not imaged onto the second primary hexapole such that a combination fourth-order aberration is created; and
   a secondary hexapole for correcting the fourth-order aberration and a sixth-order aberration, wherein the secondary hexapole is positioned between the second primary hexapole and the lens when used in the charged particle microscope system.

2. The corrector of claim 1, wherein the secondary hexapole is configured such that, when a third excitation is applied to the secondary hexapole, the secondary hexapole creates a second-order aberration that creates a primary combination aberration that corrects the fourth-order aberration.

3. The corrector of claim 1, wherein the secondary hexapole is further configured to correct for the three-fold astigmatism $A_2$.

4. The corrector of claim 1, wherein the first excitation and the second excitation are such that first contributions to the three-fold astigmatism $A_2$ generated by the first primary hexapole field and second contributions to the three-fold astigmatism $A_2$ generated the second primary hexapole field do not cancel.

5. A corrector for correcting axial aberrations in a charged particle system, the corrector comprising:
   a first primary multipole that generates a first primary multipole field when a first excitation is applied to the first primary multipole;
   a second primary multipole that generates a second primary multipole field when a second excitation is applied to the second primary multipole, wherein the second primary multipole is positioned between the first primary multipole and a lens which is a source of spherical aberration when used in the charged particle system, wherein the first primary multipole is not imaged onto the second primary multipole such that a combination fourth-order aberration is created; and
   a secondary multipole for correcting the fourth-order aberration and a sixth-order aberration, wherein the secondary multipole is positioned between the second primary multipole and the lens when used in the charged particle system.

6. The corrector of claim 5, wherein the secondary multipole is further configured to correct for the three-fold astigmatism $A_2$.

7. The corrector of claim 5, wherein the secondary multipole is configured such that:
   the secondary multipole generates a third multipole field when a third excitation is applied to the secondary multipole, and
   the third multipole field creates one or more aberrations that correct the fourth-order aberration and the sixth-order aberration.

8. The corrector of claim 5, further comprising a tertiary multipole for correcting an eighth-order aberration, wherein the tertiary multipole is positioned between the secondary multipole and the lens when used in the charged particle system.

9. The corrector of claim 8, wherein the tertiary multipole is configured such that:
   it generates a fourth multipole field when a fourth excitation is applied to the tertiary multipole; and
   the fourth multipole field creates one or more aberrations that correct the eighth-order aberration.

10. The corrector of claim 5, wherein the secondary multipole creates a second-order aberration that creates a combination aberration that corrects the fourth-order aberration.

11. The corrector of claim 5, wherein the first excitation and the second excitation are such that first contributions to the three-fold astigmatism $A_2$ generated by the first primary multipole field and second contributions to the three-fold astigmatism $A_2$ generated the second primary multipole field do not cancel.

12. The corrector of claim 5, wherein the first primary multipole not being imaged onto the second primary multipole corresponds to a first displacement of one of the first primary multipole or the second primary multipole along a central axis from a position where the first primary multipole is imaged onto the second primary multipole.

13. The corrector of claim 12, wherein the first primary multipole not being imaged onto the second primary multipole further corresponds to a second displacement of the other of the first primary multipole or the second primary multipole along a central axis from a position where the first primary multipole is imaged onto the second primary multipole.

14. The corrector of claim 13, wherein the first displacement is in an opposite direction as the second displacement.

15. The corrector of claim 5, wherein the first primary multipole not being imaged onto the second primary multipole comprises a charged particle beam entering the first primary multipole at one of a divergent or convergent angle when the corrector is in use.

16. The corrector of claim 5, wherein the first primary multipole not being imaged onto the second primary multipole comprises one or more lens excitations of lenses upstream of the corrector such that, when the corrector is in use, a charged particle beam enters the first primary multipole at one of a divergent or convergent angle.

17. The corrector of claim 5, wherein the first primary multipole not being imaged onto the second primary multipole corresponds to one or more lens excitations of lenses positioned between the first primary multipole and the second primary multipole.

18. The corrector of claim 5, wherein the multipoles are hexapoles.

19. A charged particle system comprising:
   a charged particle source configured to emit a charged particle beam toward a sample;
   an optical column configured to focus the charged particle beam onto the sample, wherein the optical column comprises a corrector for correcting axial aberrations of a lens which is a source of spherical aberration, the corrector comprising:

a first primary multipole for generating a first primary multipole field when a first excitation is applied to the first primary multipole;

a second primary multipole for generating a second primary multipole field when a second excitation is applied to the second primary multipole, wherein the second primary multipole is positioned between the first primary multipole and the lens, and wherein the first primary multipole is not imaged onto the second primary multipole such that a combination fourth-order aberration is created; and a secondary multipole for correcting the fourth-order aberration and a sixth-order aberration, wherein the secondary multipole is positioned between the second primary multipole and the lens.

20. The charged particle system of claim 19, wherein the secondary multipole is configured such that, when a third excitation is applied to the secondary multipole, the secondary multipole creates a second-order aberration that creates a combination aberration that corrects the fourth-order aberration.

* * * * *